United States Patent
Yoshizumi et al.

(10) Patent No.: US 8,905,499 B2
(45) Date of Patent: Dec. 9, 2014

(54) SLIDE RAIL

(71) Applicant: Fujitsu Limited, Kawasaki-shi, Kanagawa (JP)

(72) Inventors: Takahisa Yoshizumi, Fukuoka (JP); Kazuhiro Watanabe, Fukuoka (JP); Yasuo Iwahashi, Fukuoka (JP); Motoshi Hamasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/908,384

(22) Filed: Jun. 3, 2013

(65) Prior Publication Data

US 2013/0328470 A1  Dec. 12, 2013

(30) Foreign Application Priority Data

Jun. 12, 2012 (JP) ................. 2012-133317

(51) Int. Cl.
| | |
|---|---|
| *A47B 95/00* | (2006.01) |
| *A47B 88/04* | (2006.01) |
| *A47B 88/16* | (2006.01) |

(52) U.S. Cl.
CPC ............. *A47B 88/16* (2013.01); *A47B 88/04* (2013.01)
USPC ....................... 312/333; 312/334.44

(58) Field of Classification Search
USPC ......... 312/333, 334.7, 334.8, 334.44, 334.46, 312/334.47
See application file for complete search history.

(56) References Cited

U.S. PATENT DOCUMENTS

| | | | | |
|---|---|---|---|---|
| 4,549,773 A | * | 10/1985 | Papp et al. | 384/18 |
| 5,288,126 A | * | 2/1994 | Saul et al. | 297/85 R |
| 6,749,276 B2 | * | 6/2004 | Judge et al. | 312/334.47 |
| 7,150,509 B2 | * | 12/2006 | Chen et al. | 312/334.47 |
| 7,413,269 B2 | * | 8/2008 | Chen et al. | 312/333 |
| 7,648,214 B2 | * | 1/2010 | Chen et al. | 312/334.47 |
| 7,744,174 B2 | * | 6/2010 | Peng et al. | 312/333 |
| 7,758,134 B2 | * | 7/2010 | Huang | 312/334.47 |
| 8,393,692 B2 | * | 3/2013 | Yu et al. | 312/333 |
| 8,672,431 B2 | * | 3/2014 | Chen et al. | 312/334.46 |
| 2003/0178922 A1 | * | 9/2003 | Chen et al. | 312/334.44 |

FOREIGN PATENT DOCUMENTS

| | | |
|---|---|---|
| JP | 6-10550 | 1/1994 |
| JP | 2004-8463 | 1/2004 |

* cited by examiner

*Primary Examiner* — Matthew Ing
(74) *Attorney, Agent, or Firm* — Staas & Halsey LLP

(57) ABSTRACT

There is provided a slide rail which includes a first rail member, a second rail member provided slidably with respect to the first rail member, the second rail member including a hole portion opening at least on a surface of the second rail member on the side of the first rail member, a lock lever and a rotating shaft provided on the surface of second rail member on the side of the first rail member, the lock lever being provided to be able to rotate about the rotating shaft, the lock lever including a tongue portion, the tongue portion being formed so as to be inserted in the hole portion, and a receiving portion provided on the second rail member and configured to hold the tongue portion of the lock lever from the direction of the first rail member.

20 Claims, 40 Drawing Sheets

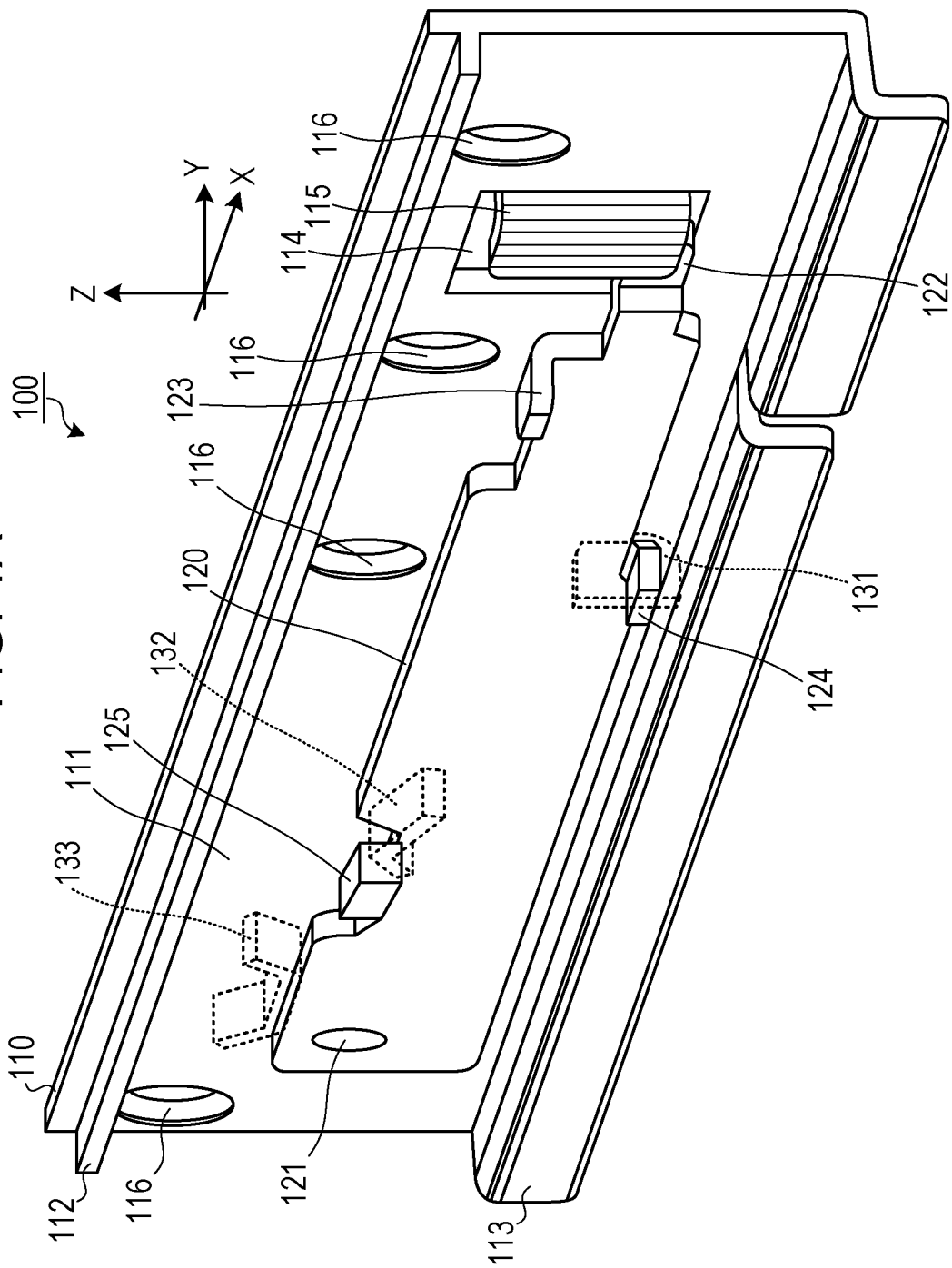

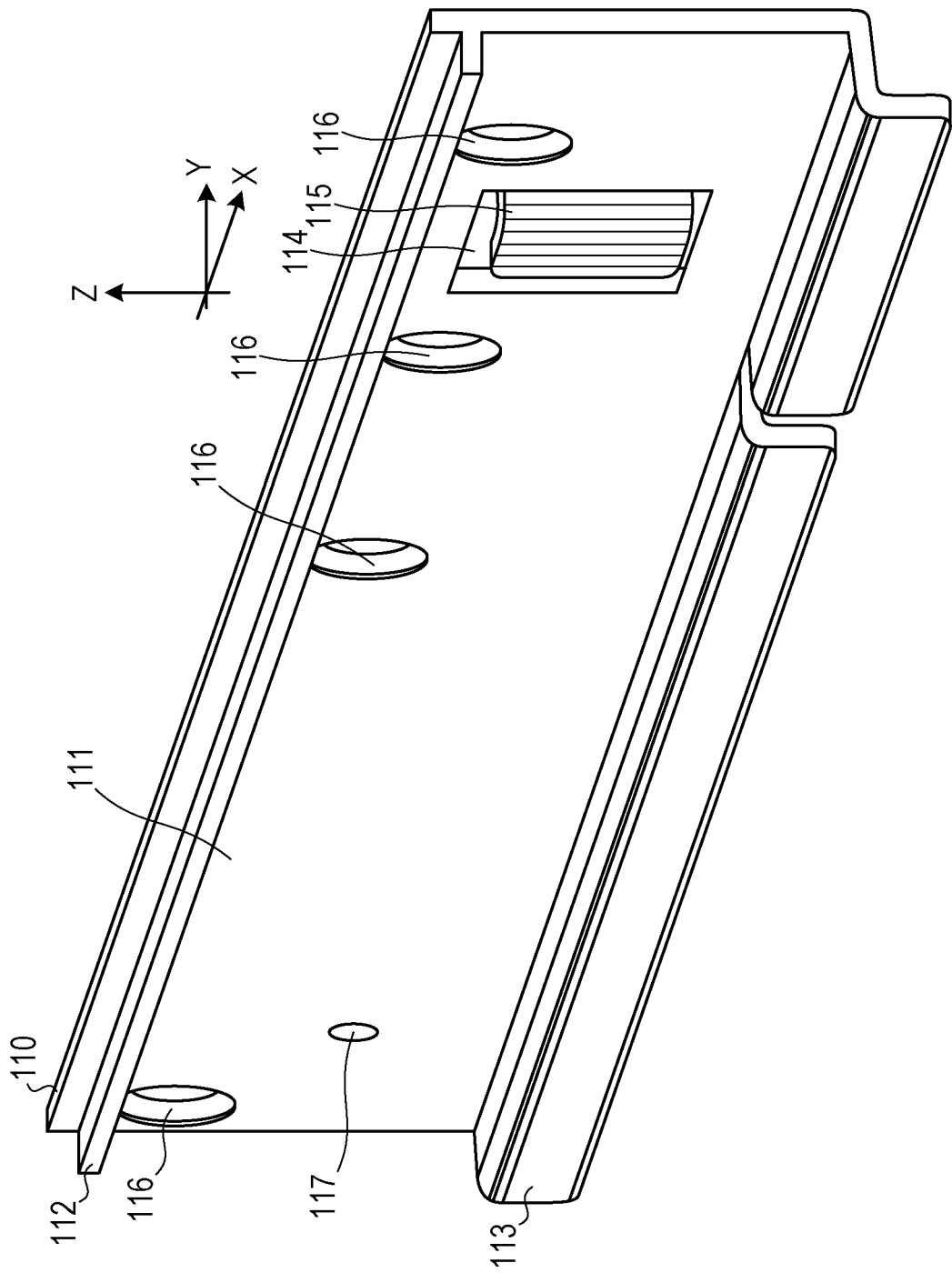

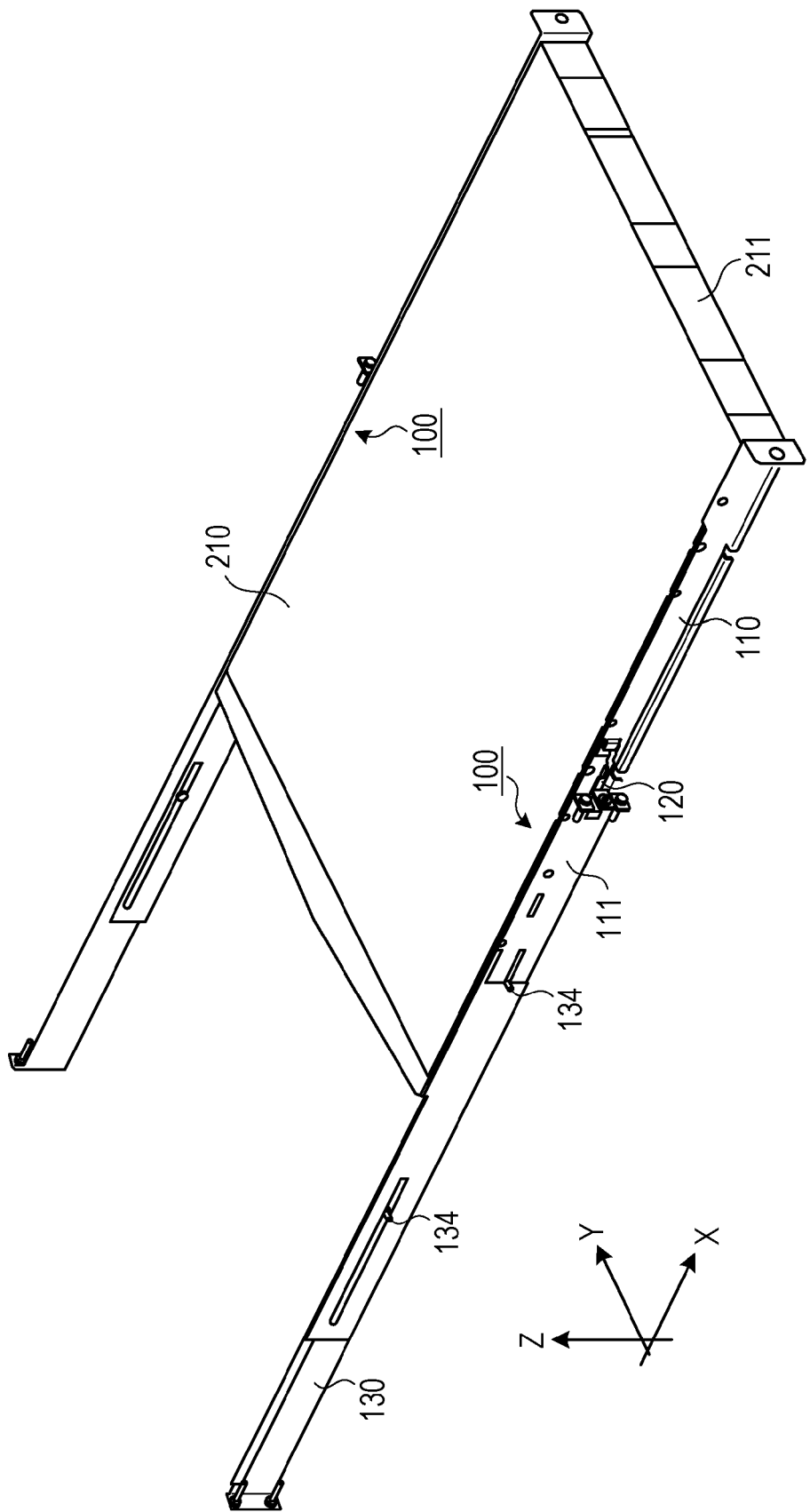

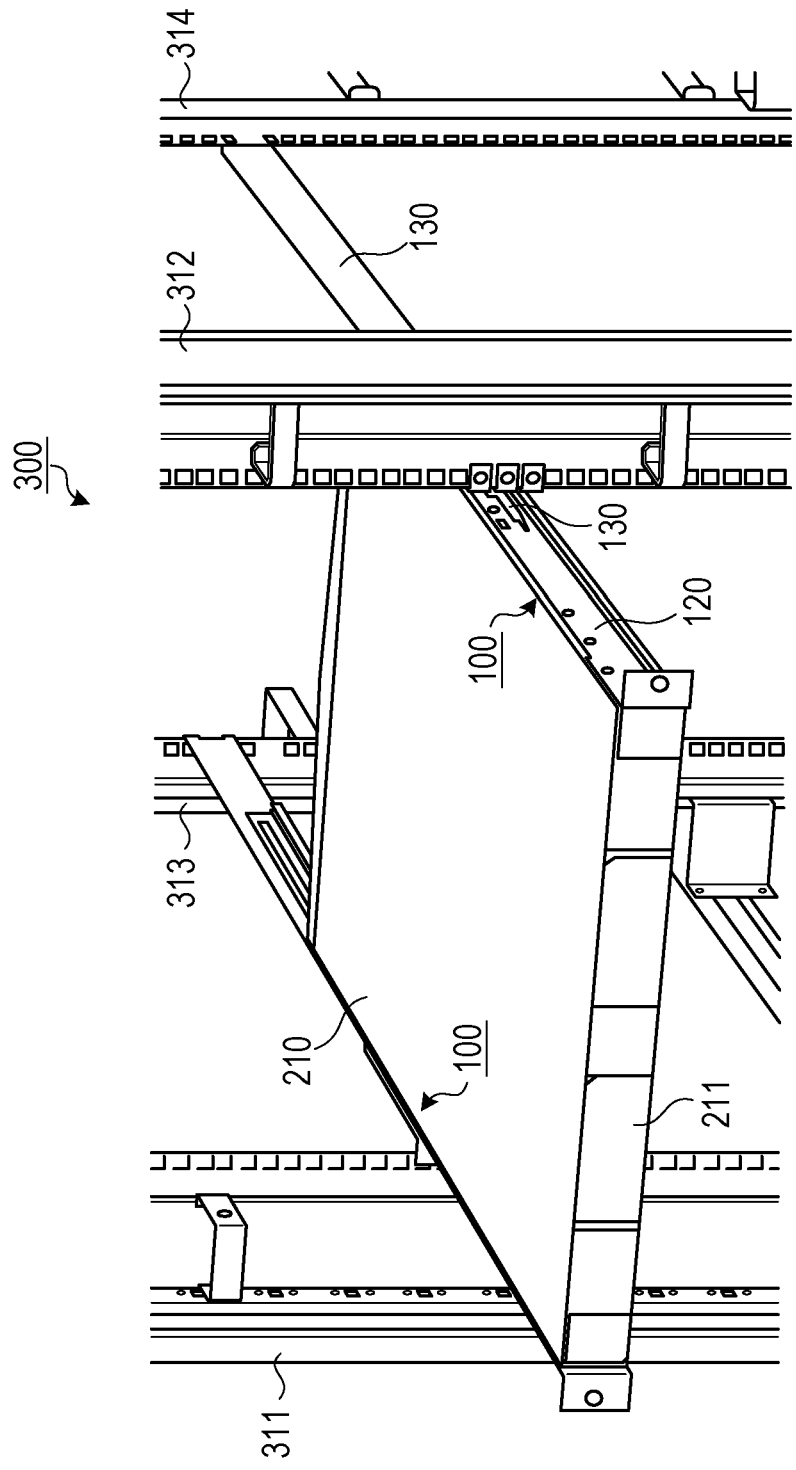

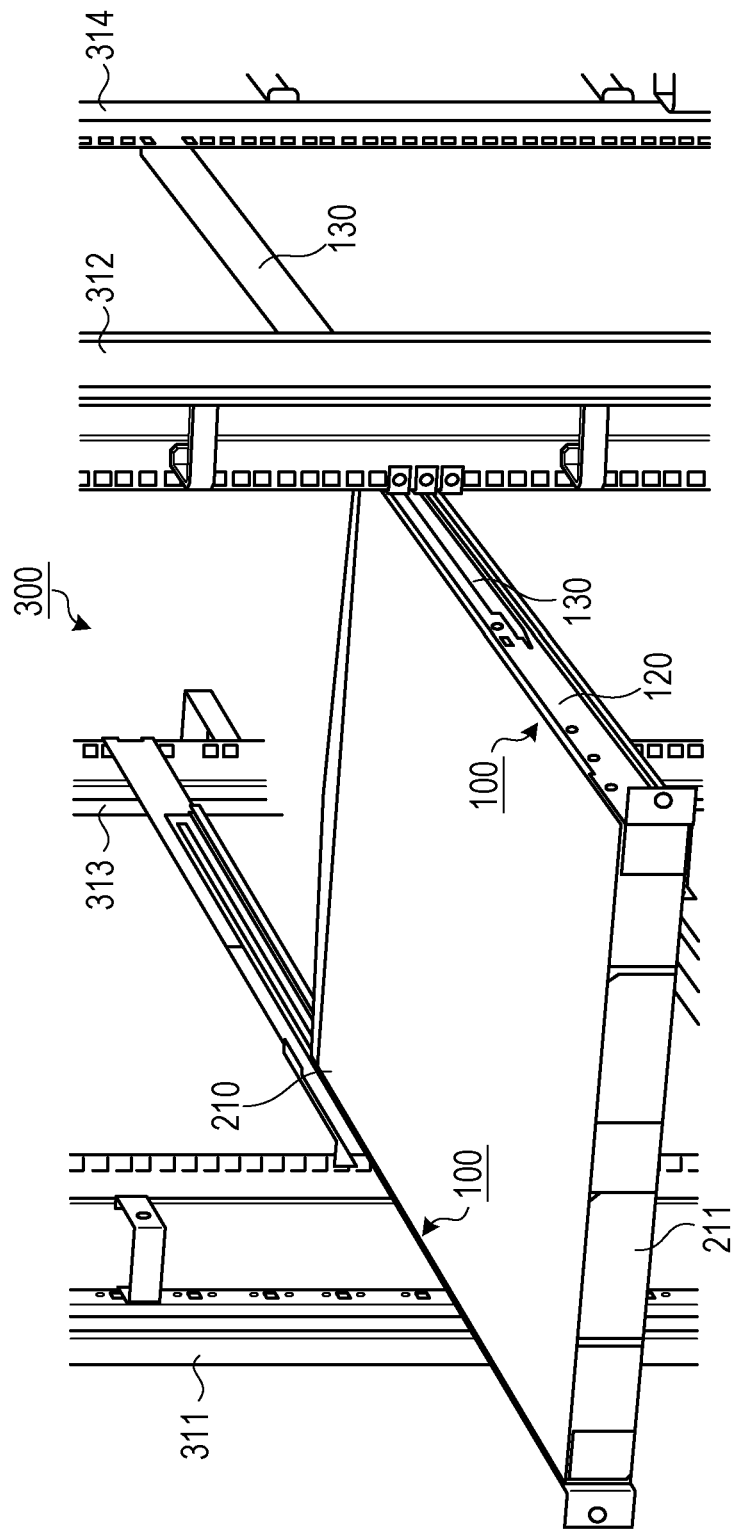

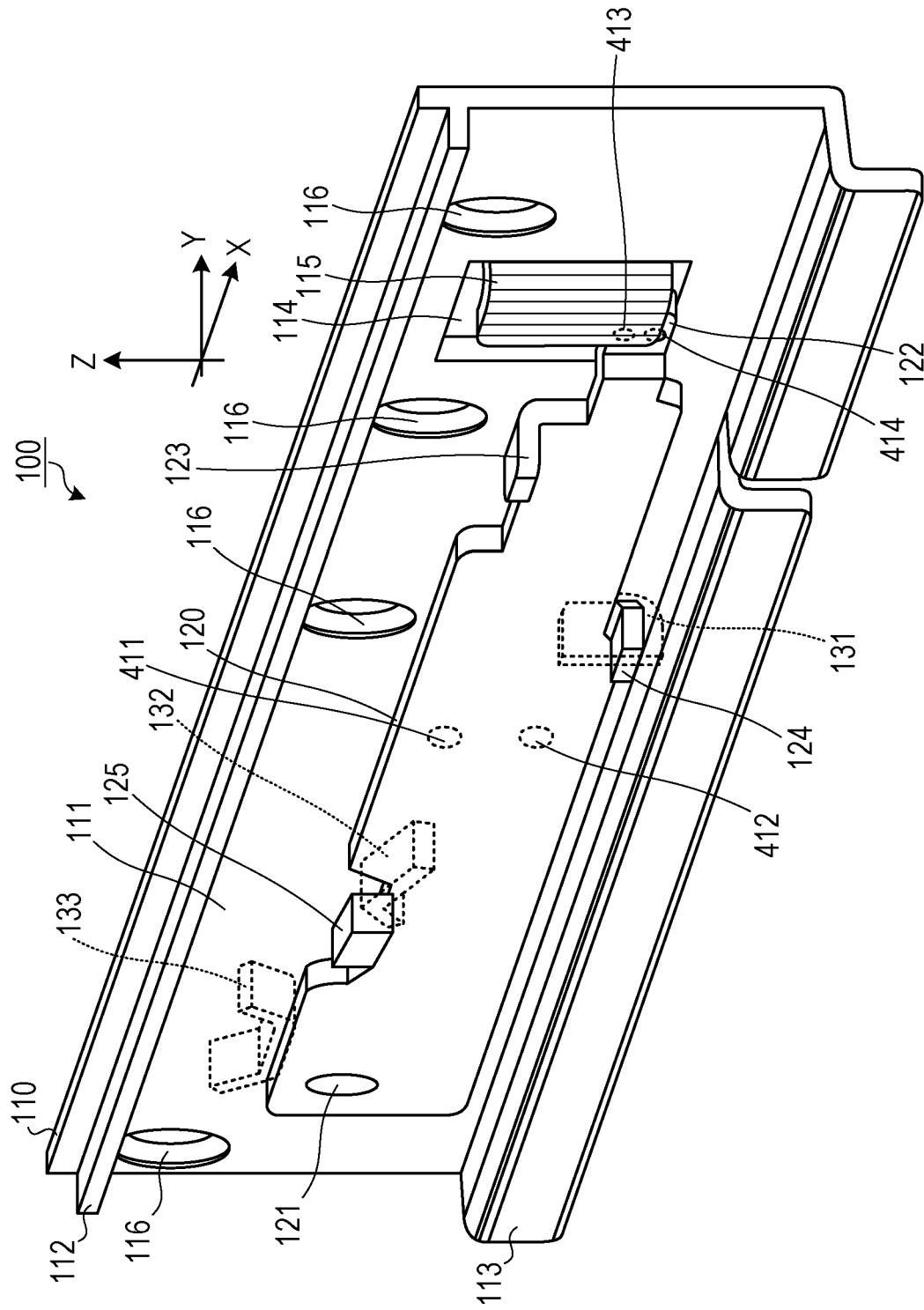

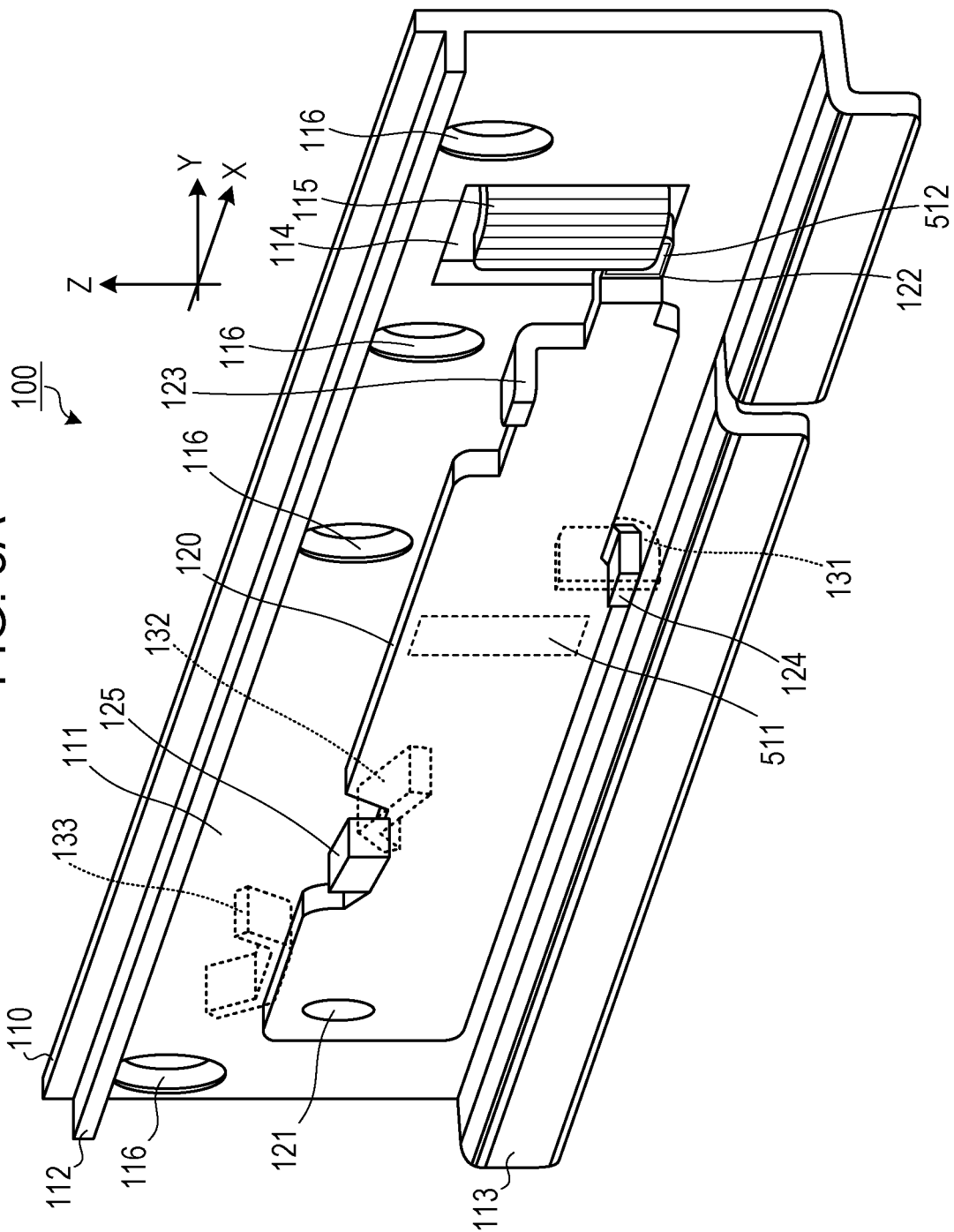

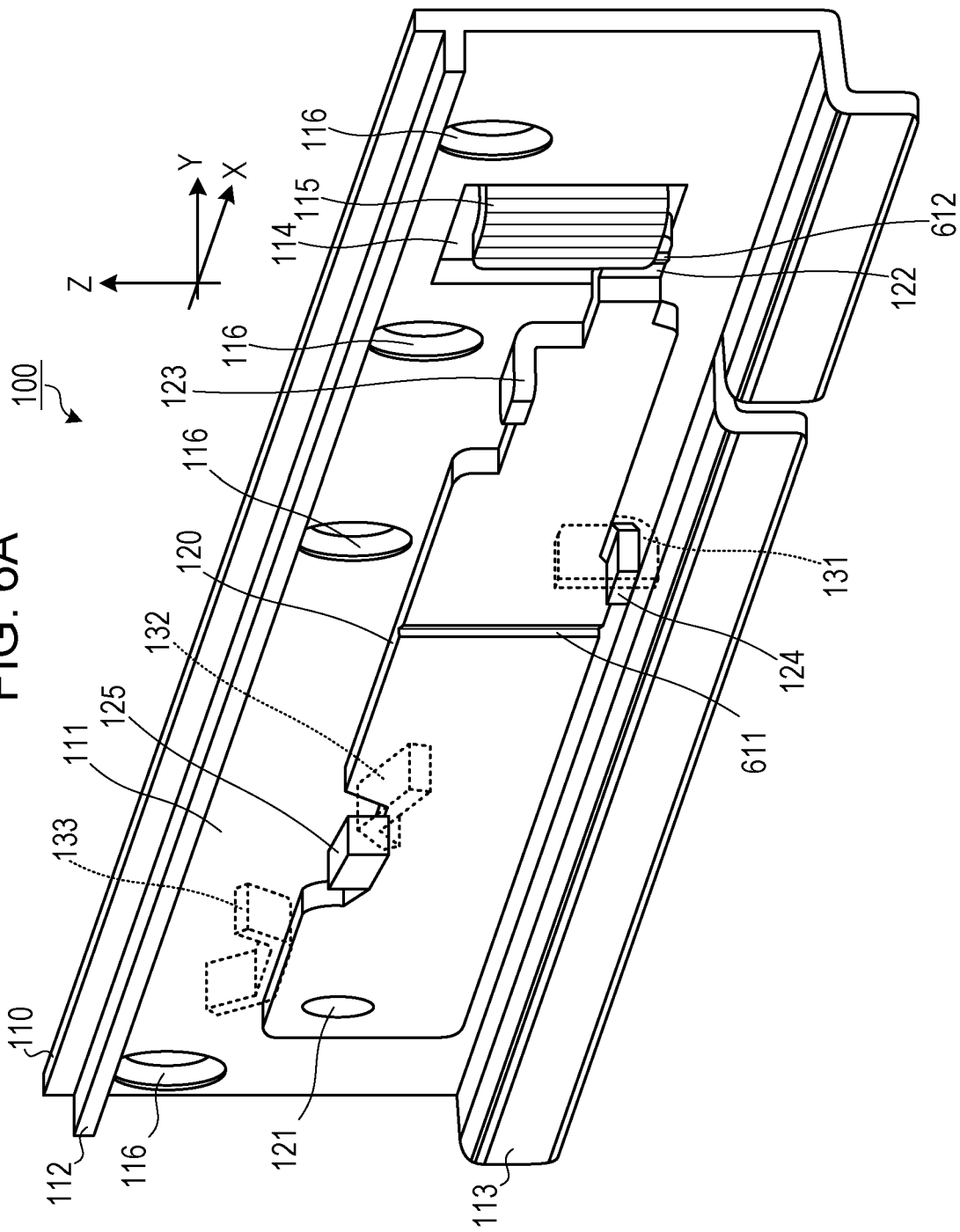

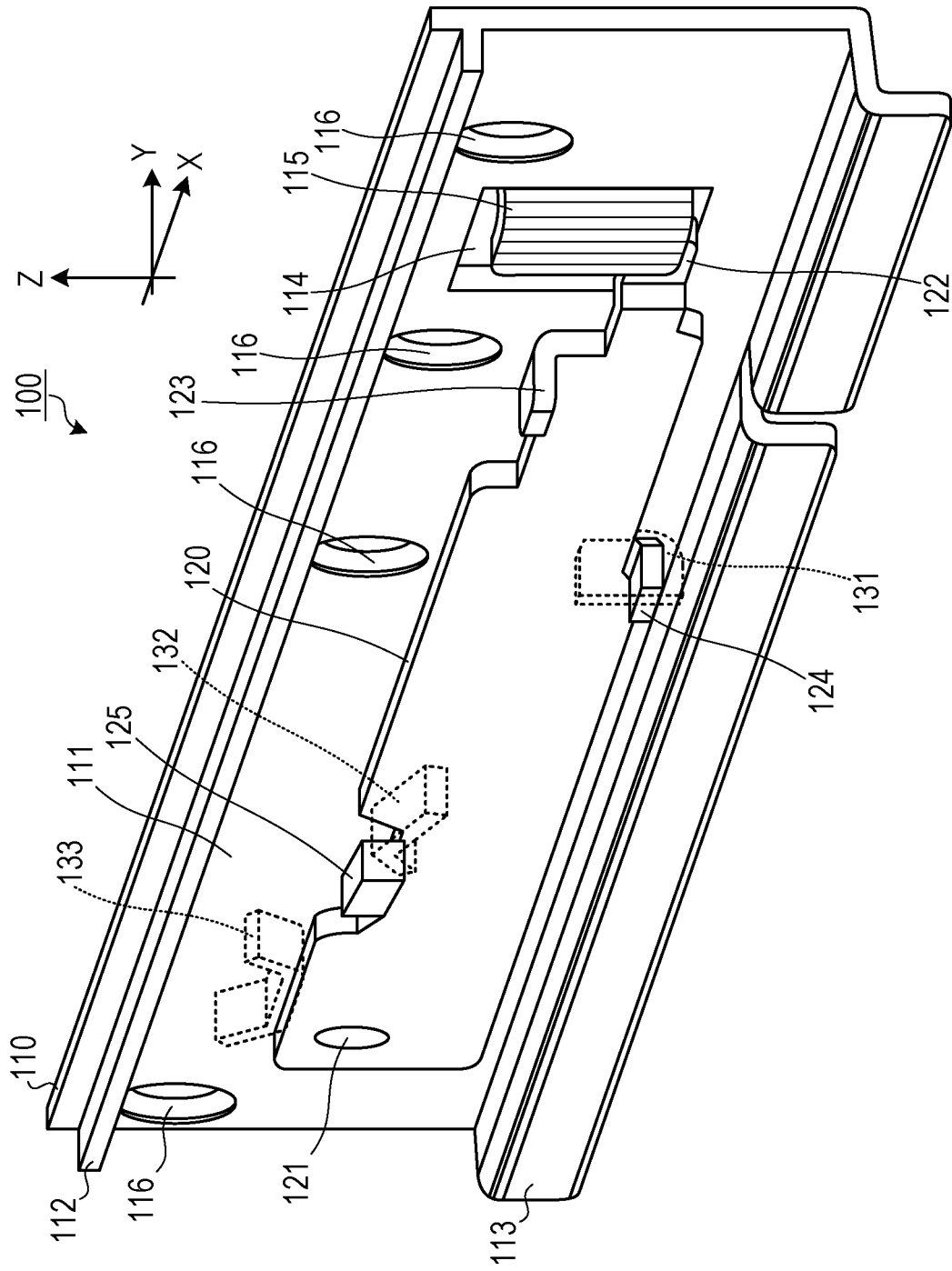

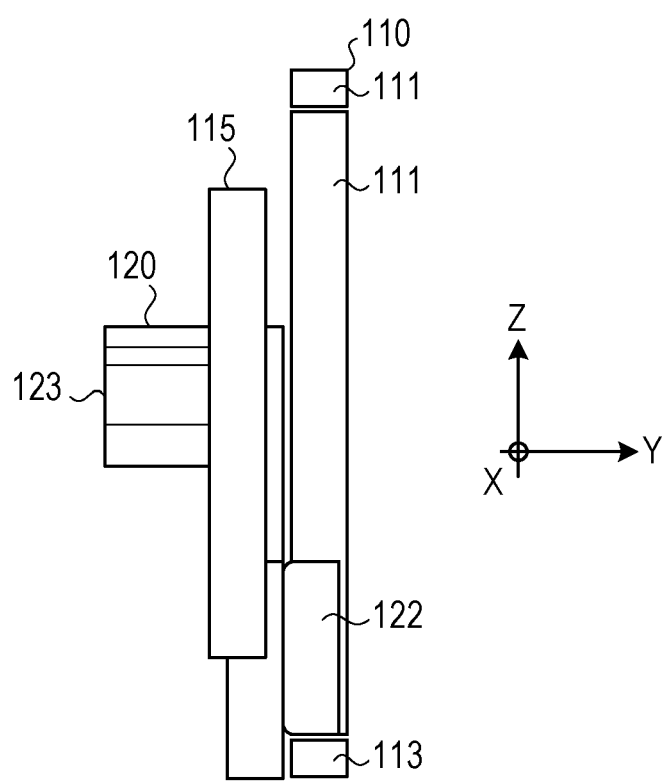

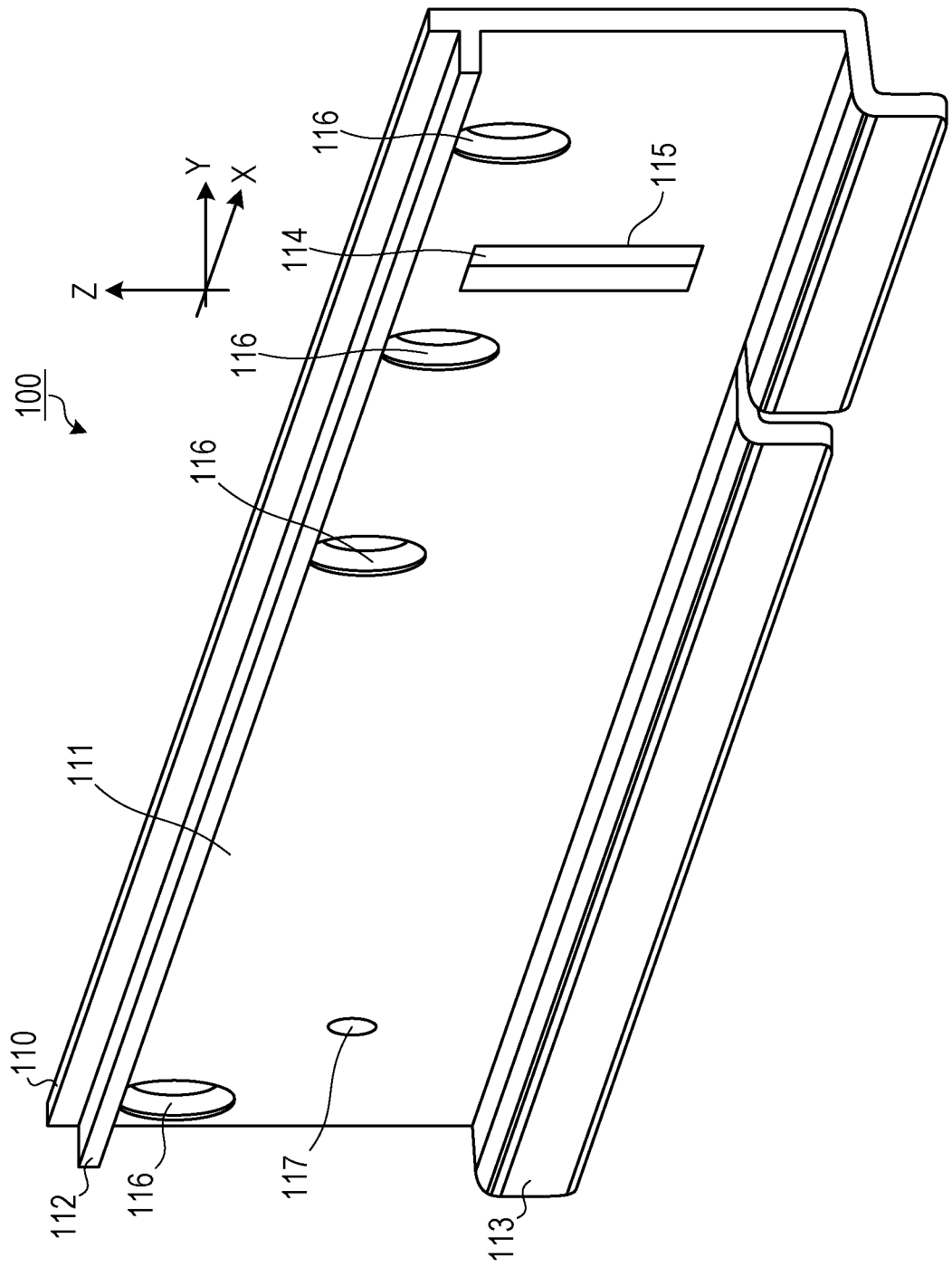

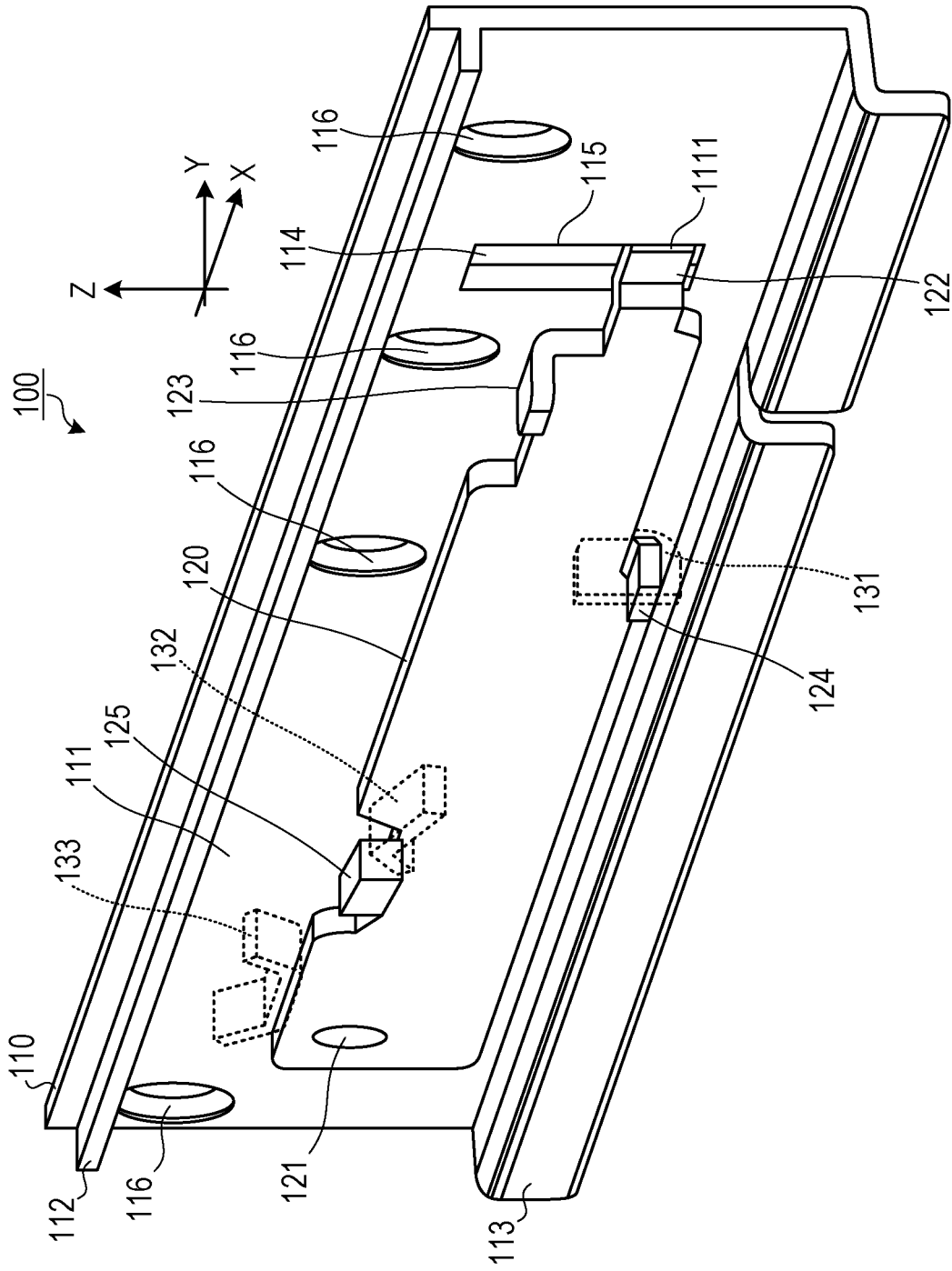

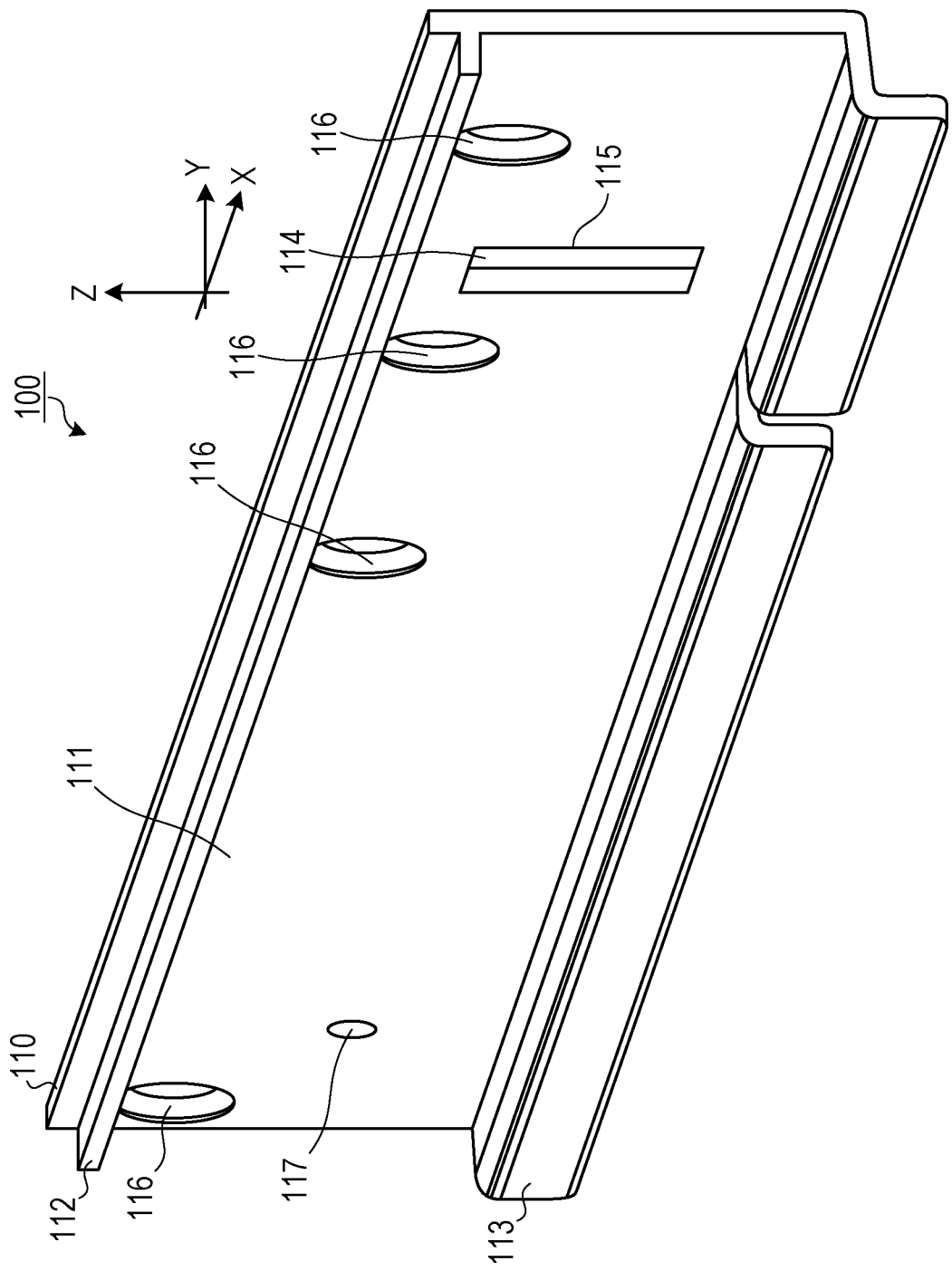

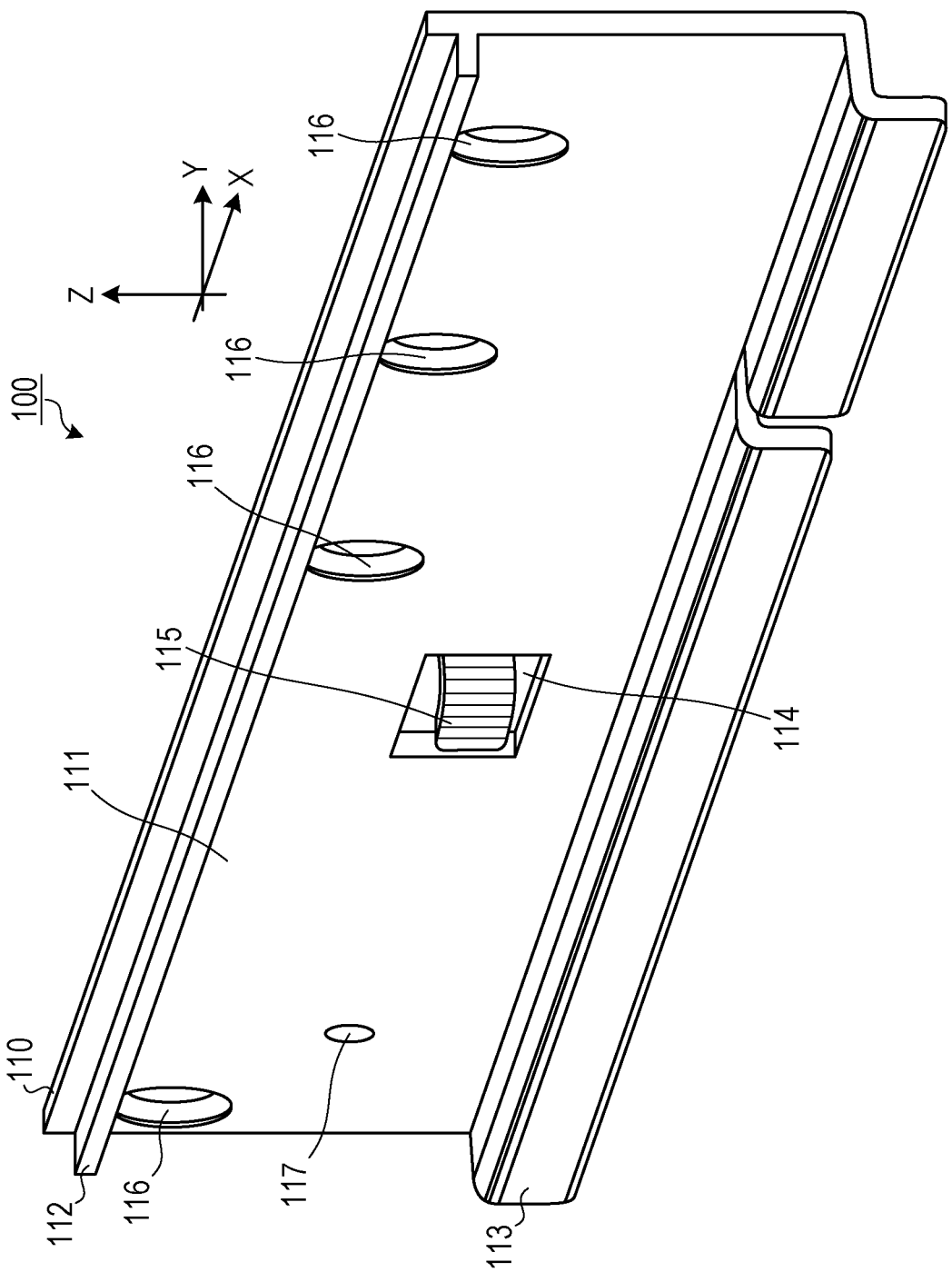

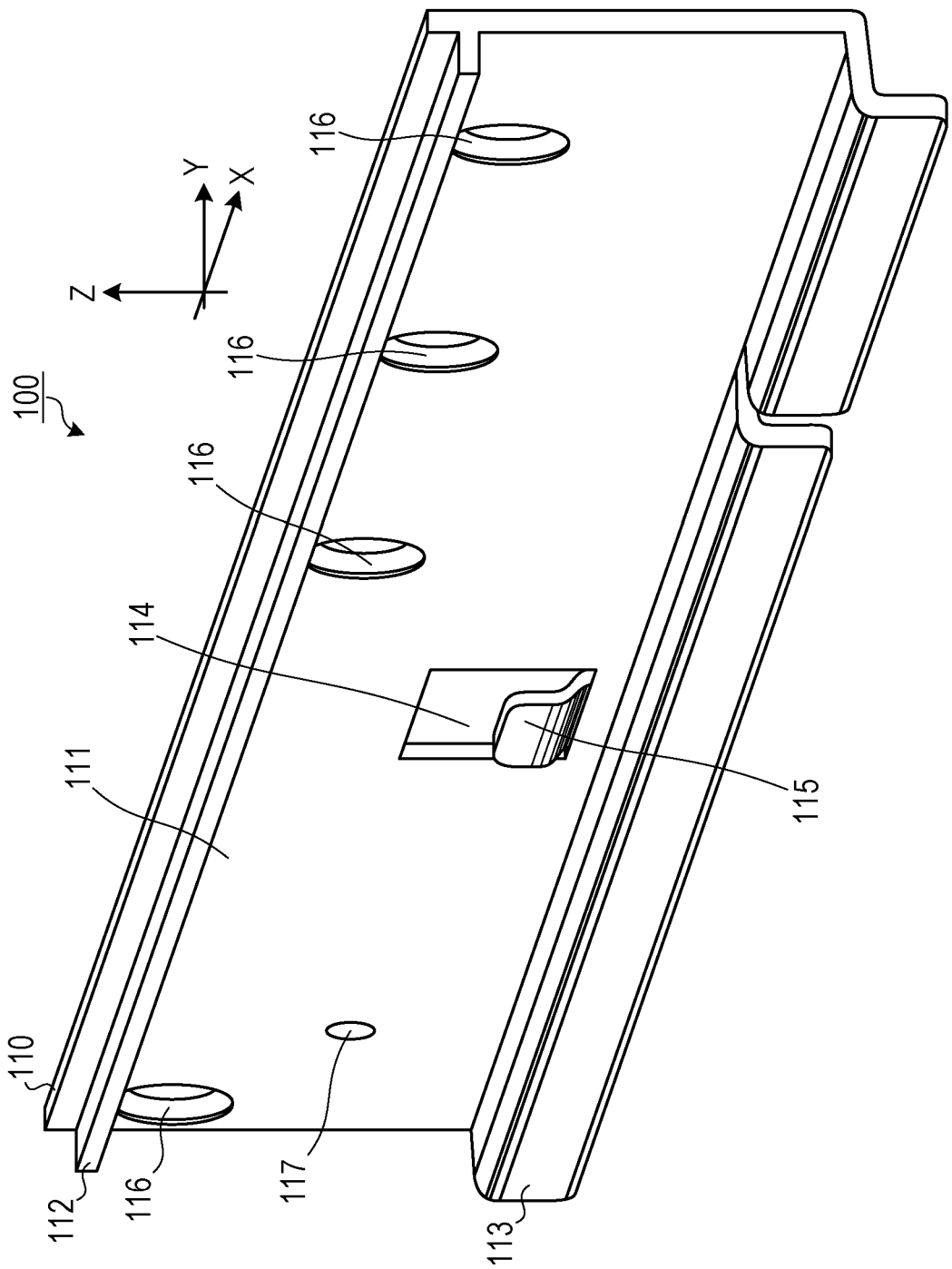

SLIDE RAIL

CROSS-REFERENCE TO RELATED APPLICATION

This application is based upon and claims the benefit of priority of the prior Japanese Patent Application No. 2012-133317, filed on Jun. 12, 2012, the entire contents of which are incorporated herein by reference.

FIELD

The embodiment discussed herein are related to a slide rail.

BACKGROUND

In the related art, a rack to be installed in a data center or a communication station for storing a plurality of apparatuses collectively is known. The apparatuses are pulled out from the rack by a sliding movement of an inner rail which grips the apparatuses with respect to an outer rail fixed to a brace member or the like. Also, a locking mechanism configured to switch a slide of the inner rail between a locked state and an unlocked state by the operation of a lock lever provided on the inner rail is known.

Japanese Laid-open Patent Publication No. 6-10550 and Japanese Laid-open Patent Publication No. 2004-8463 are examples of related art.

However, in the related art as described above, opening of the lock lever with respect to the inner rail by a force applied to the lock lever may result in damage or the like.

SUMMARY

According to an aspect of the invention, a slide rail includes a first rail member, a second rail member provided slidably with respect to the first rail member, the second rail member including a hole portion opening at least on a surface of the second rail member on the side of the first rail member, a lock lever and a rotating shaft provided on the surface of second rail member on the side of the first rail member, the lock lever being provided to be able to rotate about the rotating shaft, the lock lever including a tongue portion, the tongue portion being formed so as to be inserted in the hole portion, and a receiving portion provided on the second rail member and configured to hold the tongue portion of the lock lever from the direction of the first rail member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a perspective drawing illustrating a first configuration example 1 of a slide rail according to an embodiment;

FIG. 1B is a perspective view of an inner rail illustrated in FIG. 1A;

FIG. 2A is a perspective view illustrating an example of application of the slide rail;

FIG. 3A is a perspective view illustrating an example of a rack in which an apparatus is stored;

FIG. 3B is a perspective view illustrating an example of a state in which the apparatus is pulled out from the rack;

FIG. 4A is a perspective drawing illustrating a configuration example 2 of the slide rail according to the embodiment;

FIG. 5A is a perspective view of a configuration example 3 of the slide rail according to the embodiment;

FIG. 6A is a perspective view of a configuration example 4 of the slide rail according to the embodiment;

FIG. 9A is a perspective view illustrating a configuration example 7 of the slide rail according to the embodiment;

FIG. 9B is a cross-sectional view of the slide rail illustrated in FIG. 9A when viewed from the X-axis direction;

FIG. 10B is a perspective view of the inner rail illustrated in FIG. 10A;

FIG. 11A is a perspective view of a modification of the slide rail illustrated in FIG. 10A;

FIG. 11B is a perspective view of the inner rail illustrated in FIG. 11A;

FIG. 12B is a perspective view of the inner rail illustrated in FIG. 12A;

FIG. 13B is a perspective view of the inner rail illustrated in FIG. 13A;

DESCRIPTION OF EMBODIMENTS

Hereinafter, referring now to the attached drawings, an embodiment of a slide rail according to the embodiment disclosed herein will be described in detail.

According to an aspect of the invention, a slide rail described below may be suitable for suppressing opening of the lock lever.

Embodiment

Configuration Example 1

Figure 1C:
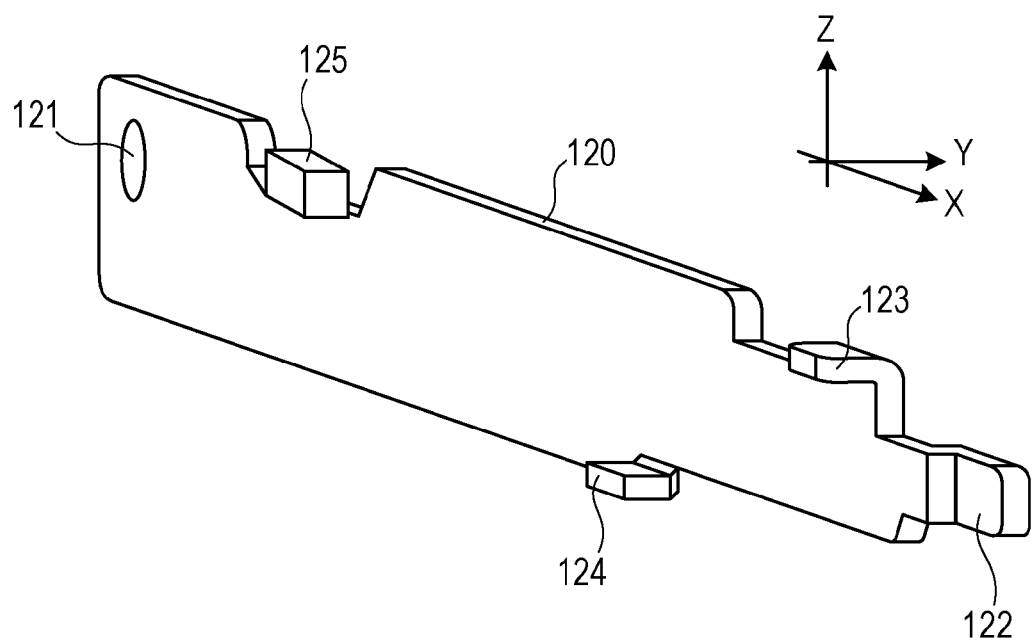
FIG. 1C is a perspective view of a lock lever illustrated in FIG. 1A.

FIG. 1A is a perspective view illustrating a configuration example 1 of a slide rail according to an embodiment. FIG. 1B is a perspective view of an inner rail illustrated in FIG. 1A. FIG. 1C is a perspective view of a lock lever illustrated in FIG. 1A.

A slide rail 100 according to the embodiment is a slide rail configured to pull out an apparatus stored in a rack from the rack or insert and store the apparatus into the rack. The slide rail 100 includes an inner rail 110 (second rail member), a lock lever 120, and an outer rail 130 (first rail member).

In FIG. 1A and so forth, the outer rail 130 is partially illustrated, and only a stopper 131, a lever push-up portion 132, and a lever push-down portion 133 of the outer rail 130 are illustrated by dot-lines. The outer rail 130 is provided on the side of the Y-axis minus direction of the inner rail 110, and is fixed to a column or the like of the rack.

The surface of the inner rail 110 on the side of a Y-axis plus direction grips a side surface of the apparatus to be stored in the rack. The inner rail 110 is provided so as to be slidable in an X-axis direction with respect to the outer rail 130. For example, the X-axis pulse direction is a drawing direction in which the inner rail 110 may be pulled out from the outer rail 130. An X-axis minus direction is a pushing direction in which the inner rail 110 may be pushed into the outer rail 130.

The inner rail 110 includes a holding surface 111, rail portions 112 and 113, a hole portion 114, a receiving portion 115, a plurality of screw holes 116, and haft hole 117. The lock lever 120 includes a rotating shaft 121, a tongue portion 122, an operating portion 123, an abutting portion 124, and a push up/down operating portion 125.

The apparatus is fixed to a surface of the holding surface 111 on the side of the Y-axis minus direction with the screw holes 116 provided on the holding surface 111 and screws. The rail portions 112 and 113 engage the outer rail 130 so as to allow the inner rail 110 to displace only in the X-axis direction with respect to the outer rail 130.

The holding surface 111 is provided with the shaft hole 117 in which the rotating shaft 121 of the lock lever 120 is provided. The holding surface 111 is provided with the hole portion 114 for allowing entry of the tongue portion 122 of the lock lever 120. The hole portion 114 is a hole opening in a surface of the inner rail 110 at least on the side of the outer rail 130. In other words, the hole portion 114 is a hole penetrating through the holding surface 111 in the example illustrated in FIG. 1A and so forth. However, the hole portion 114 may be a depression or a recess provided on the surface of the holding surface 111 on the side of the Y-axis minus direction.

The length of the hole portion 114 in the Z-direction is longer than the length of the tongue portion 122 in the Z-direction. Accordingly, the lock lever 120 is rotatable about the rotating shaft 121 in a YZ plane in a range in which the tongue portion 122 is displaceable in the hole portion 114.

In this manner, the rotation of the lock lever 120 may be limited by an opening area (hole dimension) of the hole portion 114 in which the tongue portion 122 is displaceable. Accordingly, protrusion of the lock lever 120 from the inner rail 110 in a Z-axis direction may be prevented. Also, limiting the rotation of the lock lever 120 facilitates a design of positions and shapes of the stopper 131, the lever push-up portion 132, the lever push-down portion 133 and the like.

The lock lever 120 rotates about the rotating shaft 121 by an operator displacing the operating portion 123 in the Z-axis direction. The tongue portion 122 in the lock lever 120 is formed so as to be a crank shape on an XY plane. Specifically, the tongue portion 122 is formed by bending the tongue portion of the lock lever 120 in the Y-axis plus direction (on the side of the hole portion 114) and bending a distal portion with respect to the portion bent in the Y-axis plus direction further in the X-axis plus direction (the direction parallel to the inner rail 110). Accordingly, the tongue portion 122 is formed to have a shape capable of entering the hole portion 114.

The tongue portion 122 is provided at a position farthest from the rotating shaft 121 of the lock lever 120. Accordingly, the tongue portion 122 is provided on a portion of the lock lever 120 where the degree of opening (the degree of a distance between the inner rail 110 and the lock lever 120) with respect to the inner rail 110 is the largest, and the tongue portion 122 may be received by the receiving portion 115. Therefore, the degree of opening of the lock lever 120 with respect to the inner rail 110 may be reduced.

The lock lever 120 is provided with the abutting portion 124 which abuts against the stopper 131 of the outer rail 130. In a state in which the tongue portion 122 is located at a lower portion (on the side of a Z-axis minus direction as a first area) of the hole portion 114, the abutting portion 124 is overlapped with the position of the stopper 131 in the Z-axis direction. Therefore, when the inner rail 110 is slid in the X-axis plus direction to some extent with respect to the outer rail 130, the lock lever 120 becomes a locked state in which the abutting portion 124 abuts against the stopper 131, and further sliding movement thereof is hindered.

In contrast, in the state in which the operator lifts the operating portion 123 and the tongue portion 122 is located at an upper portion in the hole portion 114 (on the side of a Z-axis plus direction as a second area), the abutting portion 124 is located on the plus side with respect to the stopper 131 in the z-axis direction. Therefore, the lock lever 120 becomes an unlocked state in which the abutting portion 124 does not abut against the stopper 131 even when the inner rail 110 slides in the X-axis plus direction with respect to the outer rail 130, and hence the inner rail 110 may be pulled out from the outer rail 130.

The lock lever 120 is also provided with the push up/down operating portion 125. The push up/down operating portion 125 guides the lock lever 120 by receiving an action from the lever push-up portion 132 and the lever push-down portion 133 provided on the outer rail 130 when the inner rail 110 slides with respect to the outer rail 130 in the X-axis direction (see FIG. 14A to FIG. 14E and FIG. 15A to FIG. 15E).

Also, the holding surface 111 is provided with the receiving portion 115 configured to receive the tongue portion 122 entered into the hole portion 114 from the side of the outer rail 130. Accordingly, the range in which the tongue portion 122 is displaceable in the Y-axis minus direction is limited and, consequently, the degree of opening of the lock lever 120 with respect to the inner rail 110 may be reduced.

Figure 1D:
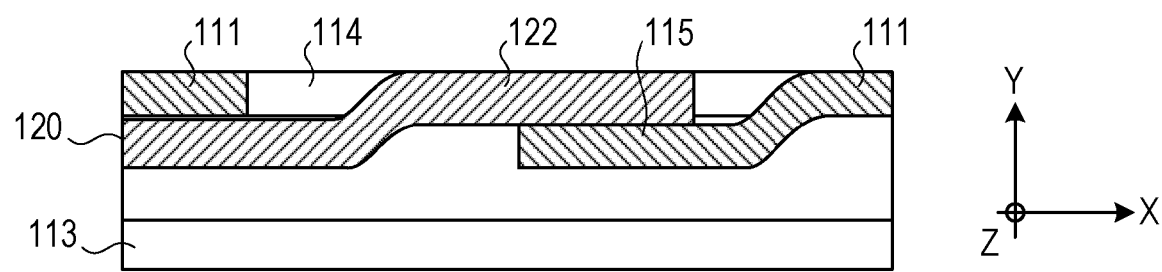
FIG. 1D is a cross-sectional view of a tongue portion and a receiving portion illustrated in FIG. 1A viewed from a Z-axis direction.

FIG. 1D is a cross-sectional view of the tongue portion and the receiving portion illustrated in FIG. 1A viewed from the Z-axis direction. As illustrated in FIG. 1D, since the tongue portion 122 of the lock lever 120 is entered into the hole portion 114, the receiving portion 115 configured hold the tongue portion 122 may be formed so as not to protrude in the Y-axis minus direction (on the side of the outer rail 130) with respect to the lock lever 120. Accordingly, while an increase in thickness of the slide rail 100 in the Y-axis direction is suppressed, a mechanism configured to reduce the degree of opening of the lock lever 120 with respect to the inner rail 110 may be achieved.

Figure 1E:
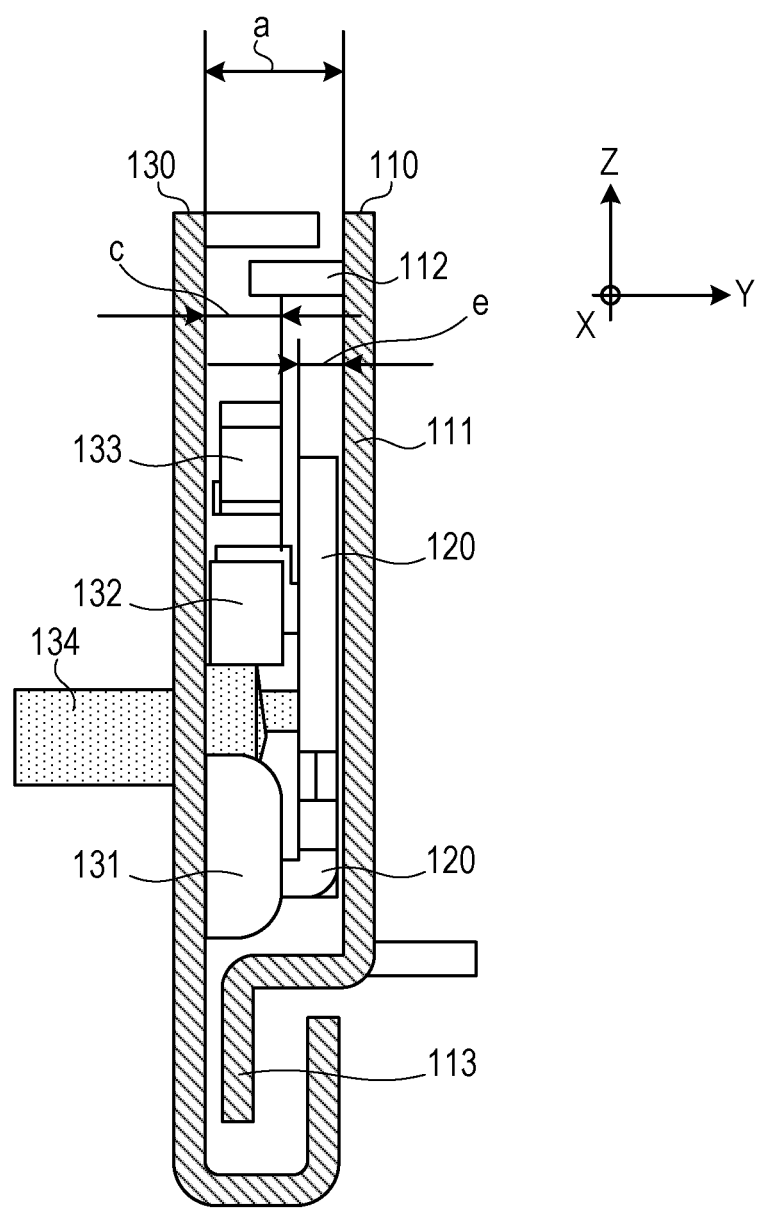
FIG. 1E is a cross-sectional view of the slide rail illustrated in FIG. 1A when viewed from an X-axis direction.

FIG. 1E is a cross-sectional view of the slide rail illustrated in FIG. 1A when viewed from the X-axis direction. A screw 134 of the outer rail 130 illustrated in FIG. 1E is a screw for expanding and contracting the outer rail 130.

A thickness "a" is thickness of a space between the inner rail 110 and the outer rail 130 in the Y-axis direction. A thickness "c" is a thickness of a protruding portion of the outer rail 130 in a Y-axis plus direction in the Y-axis direction. The protruding portion of the outer rail 130 includes, for example, the stopper 131, the lever push-up portion 132, the lever push-down portion 133, and a portion of the screw 134 protruding in the Y-axis plus direction. A thickness "e" is a thickness of the lock lever 120 in the Y-axis direction.

Here, a case where the receiving portion 115 which holds the tongue portion 122 provisionally protrudes in the Y-axis minus direction with respect to the lock lever 120 will be described. The distance of the receiving portion 115 protruding in the Y-axis minus direction with respect to the lock lever 120 is defined as a distance "d". In this case, satisfaction of a relationship of a>c+e+d is desired in order to avoid physical interference between the respective protruding portions of the outer rail 130 and the tongue portion 122, and hence the thickness "a" of the space between the inner rail 110 and the outer rail 130 is increased.

In contrast, in the slide rail 100 according to the embodiment, the receiving portion 115 holding the tongue portion 122 may be formed so as not to protrude in the Y-axis minus direction with respect to the lock lever 120 as described above. Therefore, the physical interference between the respective protrusions of the outer rail 130 and the receiving portion 115 may be avoided. Therefore, in order to avoid the physical interference between the respective protruding portions of the outer rail 130 and the lock lever 120, a relationship a>c+e is desirably satisfied. Therefore, the thickness "a" of the space between the inner rail 110 and the outer rail 130 may be reduced, and hence the thickness of the slide rail 100 may be reduced.

Figure 2B:
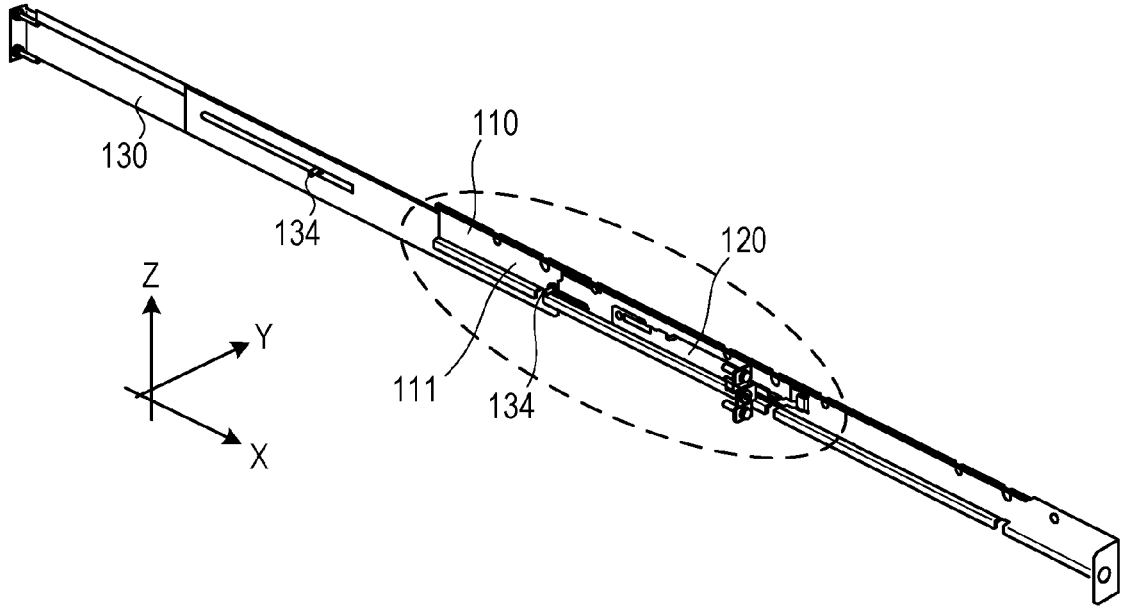
FIG. 2B is a perspective view of the slide rail illustrated in FIG. 2A in an enlarged scale.
Figure 2C:
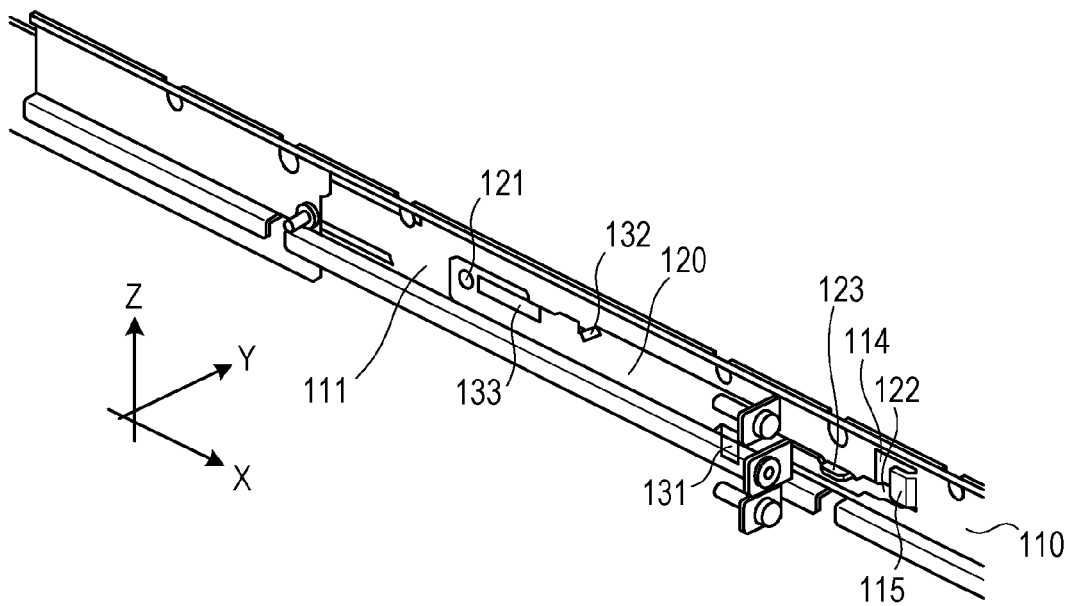
FIG. 2C is a perspective view of the slide rail illustrated in FIG. 2B in an enlarged scale.

FIG. 2A is a perspective view illustrating an example of application of the slide rail. FIG. 2B is a perspective view of the slide rail illustrated in FIG. 2A in an enlarged scale. FIG. 2C is a perspective view of the slide rail illustrated in FIG. 2B in an enlarged scale. In FIG. 2A to FIG. 2C, the same portions as those illustrated in FIG. 1A are denoted by the same reference numerals and description will be omitted.

As illustrated in FIG. 2A, the slide rail 100 is provided on an apparatus 210 to be stored in the rack. The apparatus 210 is, for example, an electronic apparatus such as a communication apparatus. A front surface 211 of the apparatus 210 is provided with, for example, an operating portion for operating the apparatus 210 or a connecting terminal for connecting the apparatus 210 with other apparatuses.

The apparatus 210 is gripped by the surface of the holding surface 111 of the inner rail 110 on the opposite to the outer rail 130. In the example illustrated in FIG. 2A, a configuration in which the inner rail 110 is provided on one of side surfaces (the surface on the side of the Y-axis minus direction) of the apparatus 210. However, the inner rail 110 may be provided on the other side surface (the surface on the side of Y-axis plus direction) of the apparatus 210.

Accordingly, the apparatus 210 may be pulled out from the rack or the apparatus 210 may be pushed inward of the rack by the sliding movement of the inner rail 110 with respect to the outer rail 130. Also, when the apparatus 210 is pulled out from the rack, the apparatus 210 may be protected from being pulled out from a predetermined position unless the lock lever 120 is lifted.

Accordingly, an event such that the apparatus 210 is pulled out from the rack unintentionally due to inclination or vibrations of the rack and thus the apparatus 210 falls down or collides with an external substance may be avoided.

As described above, the slide rail 100 may be reduced in thickness in the Y-axis direction while achieving the mechanism that reduces the degree of opening of the lock lever 120. Accordingly, the surface area of the front surface 211 of the apparatus 210 may be increased. Accordingly, for example, the surface area of the front surface 211 of the apparatus 210 on which components may be mounted may be increased.

FIG. 3A is a perspective view illustrating an example of the rack in which the apparatus is stored. FIG. 3B is a perspective view illustrating an example of a state in which the apparatus is pulled out from the rack. In FIG. 3A and FIG. 3B, the same portions as those illustrated in FIG. 2A are denoted by the same reference numerals and description will be omitted.

As illustrated in FIG. 3A and FIG. 3B, a rack 300 includes brace members 311 to 314 installed vertically. The outer rail 130 of the slide rail 100 provided on one of the side surfaces (the side surface on the near side of the drawing) of the apparatus 210 is fixed horizontally with respect to the brace members 312 and 314. The outer rail 130 of the slide rail 100 provided on the other side surface (the side surface on the far side of the drawing) of the apparatus 210 is fixed horizontally with respect to the brace members 311 and 313.

In this manner, in the slide rail 100 according to the embodiment, the lock lever 120 includes the tongue portion 122 formed so as to enter the receiving portion 115 of the inner rail 110. Then, the inner rail 110 is provided with the receiving portion 115 configured to receive the tongue portion 122 of the lock lever 120 from the side of the outer rail 130. Accordingly, an amount of opening the lock lever may be reduced to while reducing the increase in thickness.

Configuration Example 2

Portions of the slide rail 100 according to the embodiment in a configuration example 2 different from those of the slide rail 100 in the configuration example 1 will be described.

Figure 4B:
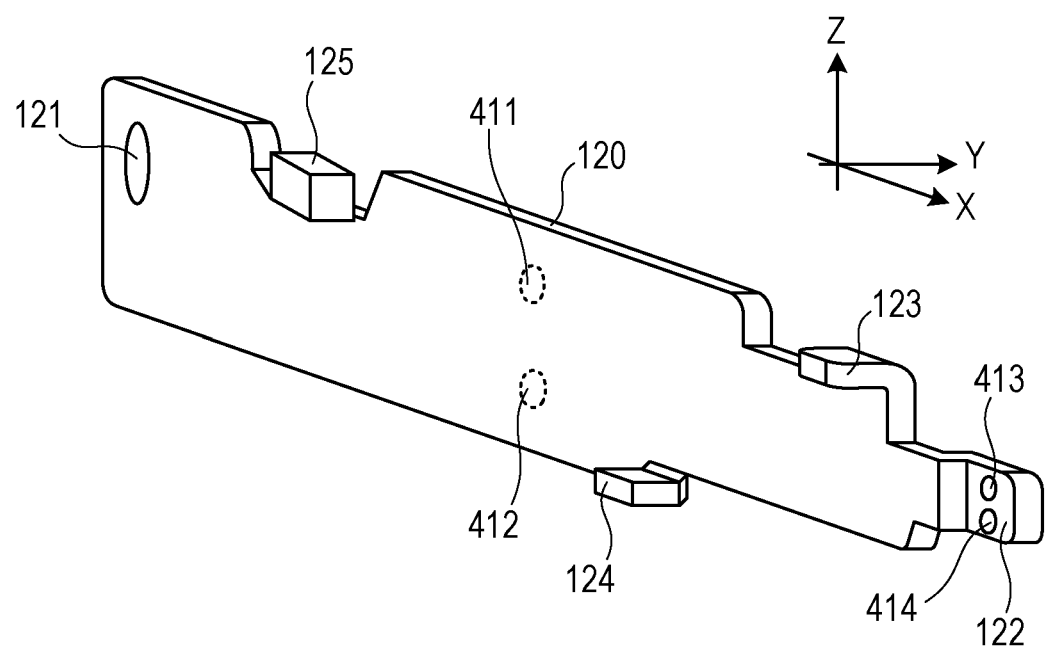
FIG. 4B is a perspective view of the lock lever illustrated in FIG. 4A.

FIG. 4A is a perspective view illustrating the configuration example 2 of the slide rail according to the embodiment. The inner rail 110 illustrated in FIG. 4A is the same as the inner rail 110 illustrated in FIG. 1B, for example. FIG. 4B is a perspective view of the lock lever illustrated in FIG. 4A. In FIG. 4A and FIG. 4B, the same portions as those illustrated in FIG. 1A and FIG. 1c are respectively denoted by the same reference numerals and description will be omitted.

The lock lever 120 according to the configuration example 2 is provided with projecting portions 411 to 414. The projecting portions 411 and 412 are provided on a surface of the body portion of the lock lever 120 on the side of the inner rail 110. The projecting portions 413 and 414 are provided on a surface of the tongue portion 122 of the lock lever 120 on the side of the receiving portion 115. The projecting portions 411 to 414 are formed by processing the inner rail 110, for example.

Figure 4C:
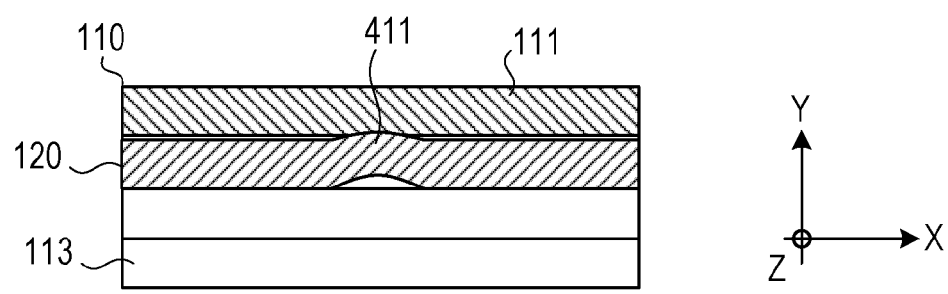
FIG. 4C is a cross-sectional view of a projecting portion provided on a body portion of the lock lever illustrated in FIG. 4A when viewed from the Z-axis direction.
Figure 4D:
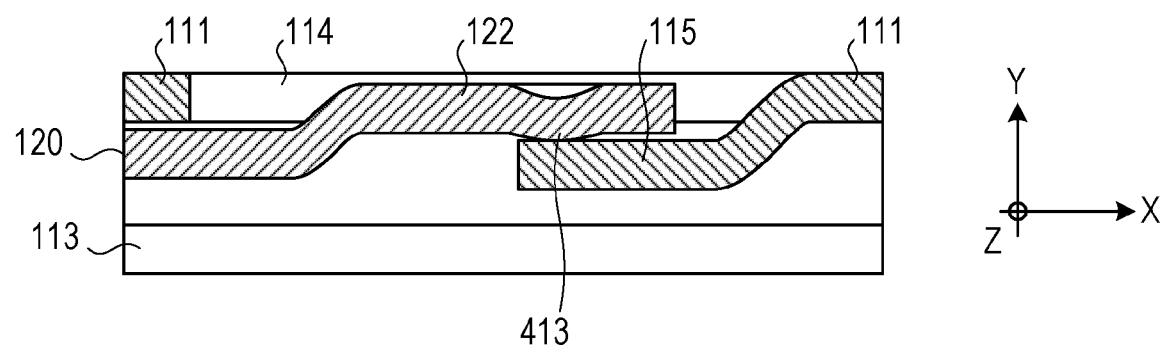
FIG. 4D is a cross sectional view of the projecting portion provided on the tongue portion of the lock lever illustrated in FIG. 4A.

FIG. 4C is a cross-sectional view of a projecting portion provided on the body portion of the lock lever illustrated in FIG. 4A when viewed from the Z-axis direction. FIG. 4D is a cross-sectional view of a projecting portion provided on the tongue portion of the lock lever illustrated in FIG. 4A when viewed from the Z-axis direction.

In this manner, the lock lever 120 according to the configuration example 2 includes the projecting portions 413 and 414 protruding toward the side of the receiving portion 115 on a portion of the tongue portion 122 received by the receiving portion 115. Accordingly, only the projecting portions 413 and 414 of the tongue portion 122 are allowed to come into contact with the receiving portion 115. Therefore, generation of metal powder caused by friction between the tongue portion 122 and the receiving portion 115 in association with the rotation of the lock lever 120 may be reduced.

The tongue portion 122 and the receiving portion 115 may be brought into contact with each other easily at a moderate pressure with the provision of the projecting portions 413 and 414. Accordingly, vibrations of the lock lever 120 with respect to the inner rail 110 may be reduced. Therefore, the vibrations of the lock lever 120 due to vibrations in a data center or due to transportation vibrations, for example, may be reduced.

Also, the lock lever 120 according to the configuration example 2 includes the projecting portions 411 and 412 on the body portion of the lock lever 120 so as to project on the side of the inner rail 110. Accordingly, only the projecting portions 411 and 412 of the body portion of the lock lever 120 may come into contact with the inner rail 110. Therefore, generation of metal powder caused by friction between the body portion of the lock lever 120 and the inner rail 110 in association with the rotation of the lock lever 120 may be reduced.

The body portion of the lock lever 120 and the inner rail 110 may be brought into contact with each other easily at a moderate pressure with the provision of the projecting portions 411 and 412. Accordingly, vibrations of the lock lever 120 with respect to the inner rail 110 may be reduced. Therefore, the vibrations of the lock lever 120 due to the vibrations in the data center or due to the transportation vibrations, for example, may be reduced.

In the example illustrated in FIGS. 4A to 4D, two of the projecting portions, projecting portions 413 and 414, are provided. However, one or three or more of the projecting portions may be provided on the tongue portion 122. In the example illustrated in FIGS. 4A to 4D, two of the projecting portions, projecting portions 411 and 412, are provided on the body portion of the lock lever 120. However, one or three or more of the projecting portions may be provided on the body portion of the lock lever 120.

In the configuration illustrated in FIG. 4A to 4D, a configuration in which either one of the projecting portions 411 and 412 of the body portion of the lock lever 120 and the projecting portions 413 and 414 of the tongue portion 122 of the lock lever 120 is omitted is also applicable.

Configuration Example 3

There will be described portions of the slide rail 100 according to the embodiment in a configuration example 3 different from those of the slide rail 100 in the configuration example 1.

Figure 5B:
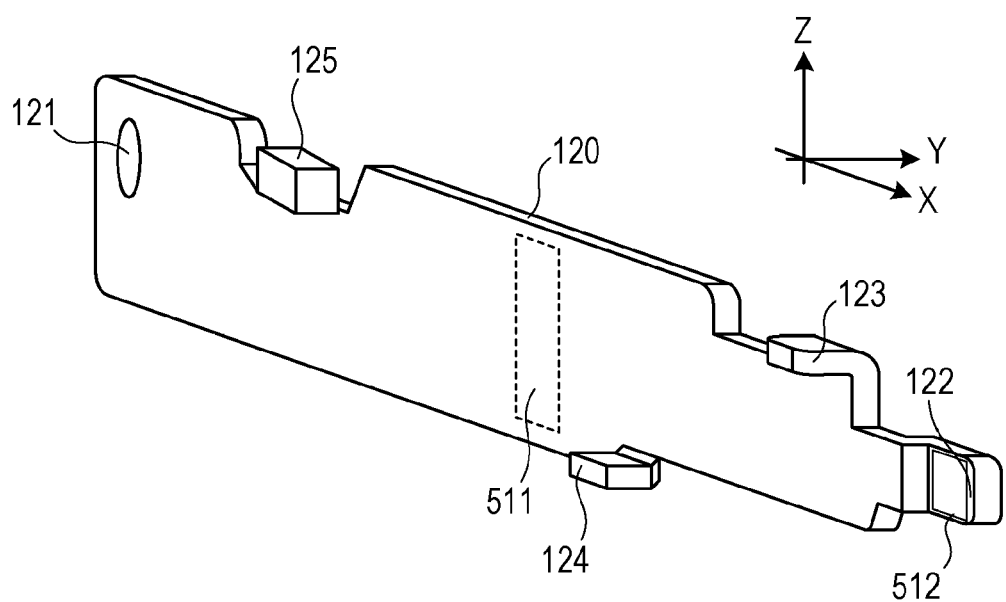
FIG. 5B is a perspective view of the lock lever illustrated in FIG. 5A.

FIG. 5A is a perspective view illustrating the configuration example 3 of the slide rail according to the embodiment. The inner rail 110 illustrated in FIG. 5A is the same as the inner rail 110 illustrated in FIG. 1B, for example. FIG. 5B is a perspective view of the lock lever illustrated in FIG. 5A. In FIG. 5A and FIG. 5B, the same portions as those illustrated in FIG. 1A to FIG. 1C are respectively denoted by the same reference numerals and description will be omitted.

The lock lever 120 according to the configuration example 3 is provided with tapes 511 and 512. The tape 511 is provided on the surface of the body portion of the lock lever 120 on the side of the inner rail 110. The tape 512 is provided on the surface of the tongue portion 122 of the lock lever 120 on the side of the receiving portion 115. The tapes 511 and 512 are, for example, tapes having a surface formed of a fluorine resin or the like and hence low in friction of the surface thereof.

In this manner, the lock lever 120 according to the configuration example 3 includes the tongue portion 122 of which a surface received by the receiving portion 115 includes the tape 512 so that the smooth surface of the tape 512 faces toward the receiving portion 115. Accordingly, the tongue portion 122 is allowed to come into contact with the receiving portion 115 via the tape 512. Therefore, generation of the metal powder caused by friction between the tongue portion 122 and the receiving portion 115 in association with the rotation of the lock lever 120 may be prevented.

The tongue portion 122 and the receiving portion 115 may be brought into contact with each other easily at a moderate pressure by the tape 512. Accordingly, the vibrations of the lock lever 120 with respect to the inner rail 110 may be reduced. Therefore, the vibrations of the lock lever 120 due to the vibrations in the data center or due to the transportation vibrations, for example, may be reduced.

Also, in the configuration example 3, the tape 511 is provided on the surface of the body portion of the lock lever 120 on the side of the inner rail 110 so that the smooth surface of the tape 511 faces toward the inner rail 110. Accordingly, the body portion of the lock lever 120 may come into contact with the inner rail 110 via the tape 511. Therefore, generation of the metal powder caused by friction between the body portion of the lock lever 120 and the inner rail 110 in association with the rotation of the lock lever 120 may be reduced.

Also, the body portion of the lock lever 120 and the inner rail 110 may be brought into contact with each other easily at a moderate pressure with the provision of the tape 511. Accordingly, the vibrations of the lock lever 120 with respect to the inner rail 110 may be reduced. Therefore, the vibrations of the lock lever 120 due to the vibrations in the data center or due to the transportation vibrations, for example, may be reduced.

In the configuration illustrated in FIG. 5A and FIG. 5B, a configuration is also applicable in which either one of the tape 511 and 412 attached to the body portion of the lock lever 120 and the tape 512 attached to the tongue portion 122 of the lock lever 120 is omitted.

Also, the lock lever 120 may include, not only the tape 511, but also a thin strip being different from the tape 511 and having a smooth surface on the side of the inner rail 110 attached on the side of the inner rail 110 on a surface of the body portion of the lock lever 120. Also, the lock lever 120 may includes, not only the tape 512, but also a thin strip having a smooth surface being different from the tape 512 and having a smooth surface on the surface on the side of the receiving portion 115 attached on the surface of the tongue portion 122 of the lock lever 120 received by the receiving portion 115.

Configuration Example 4

Portions of the slide rail 100 according to the embodiment in a configuration example 4 different from those of the slide rail 100 in the configuration example 1 will be described.

Figure 6B:
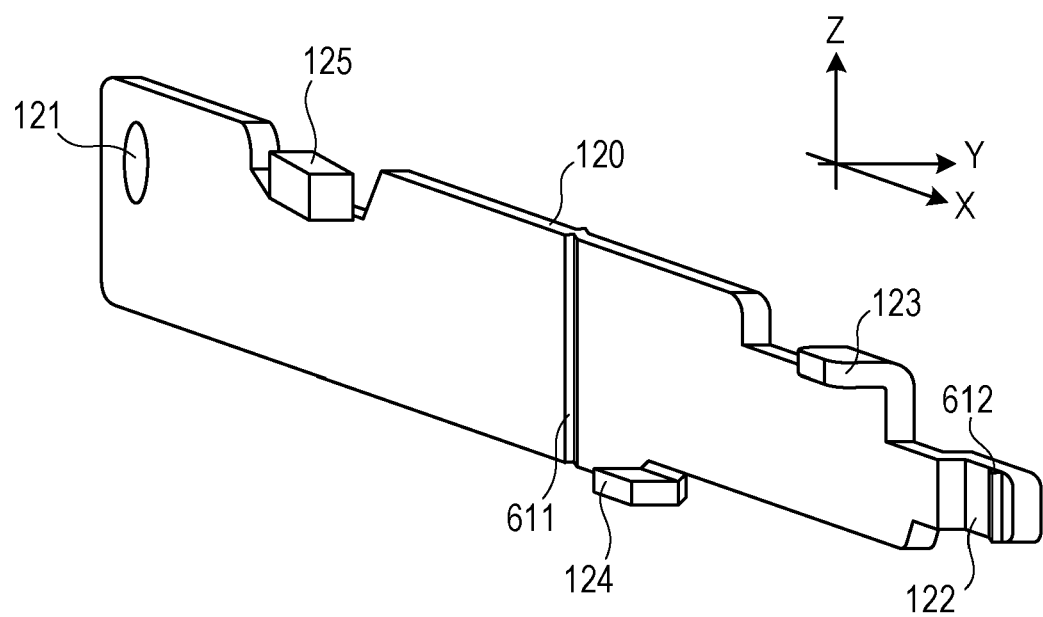
FIG. 6B is a perspective view of the lock lever illustrated in FIG. 6A.

FIG. 6A is a perspective view illustrating the configuration example 4 of the slide rail 100 according to an embodiment. The inner rail 110 illustrated in FIG. 6A is the same as the inner rail 110 illustrated in FIG. 1B, for example. FIG. 6B is a perspective view of the lock lever 120 illustrated in FIG. 6A. In FIG. 6A and FIG. 6B, the same portions as those illustrated in FIG. 1A to FIG. 1C are respectively denoted by the same reference numerals and description will be omitted.

The lock lever 120 according to the configuration example 4 is provided with protrusions 611 and 612. The protrusion 611 is provided on the surface of the body portion of the lock lever 120 on the side of the inner rail 110. The protrusion 612 is provided on the surface of the tongue portion 122 of the lock lever 120 so as facing toward the receiving portion 115. The protrusions 611 and 612 are formed by processing the inner rail 110 for example.

Figure 6C:
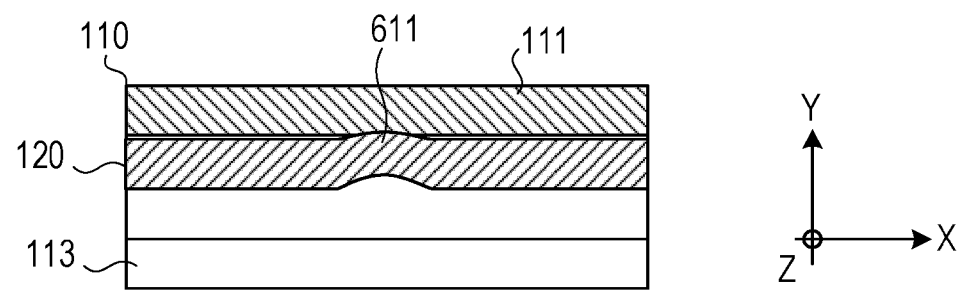
FIG. 6C is a cross-sectional view of a protrusion provided on the body portion of the lock lever illustrated in FIG. 6A when viewed from the Z-axis direction.
Figure 6D:
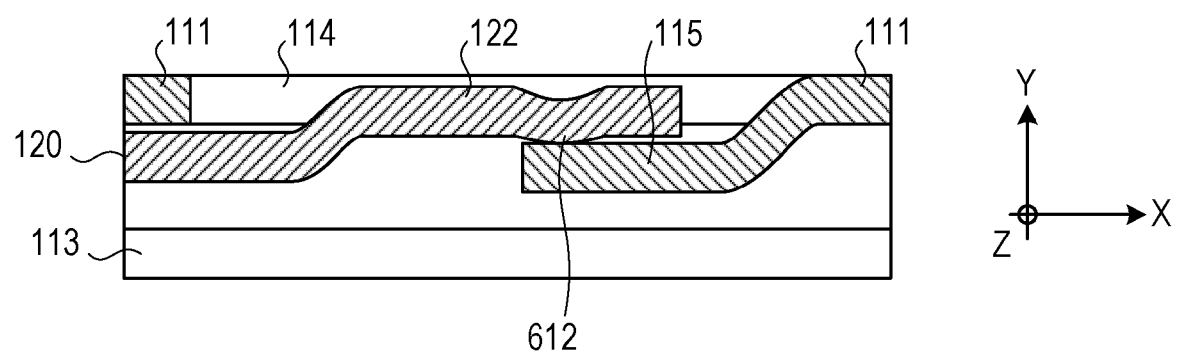
FIG. 6D is a cross-sectional view of a protrusion provided on the tongue portion of the lock lever illustrated in FIG. 6A when viewed from the Z-axis direction.

FIG. 6C is a cross-sectional view of a protruding portion provided on the body portion of the lock lever 120 illustrated in FIG. 6A when viewed from the Z-axis direction. FIG. 6D is a cross-sectional view of the tongue portion 122 provided on the protruding portion of the lock lever 120 illustrated in FIG. 6A when viewed from the Z-axis direction.

In this manner, the lock lever 120 according to the configuration example 4 includes the protrusion 612, in a linear from, provided on the portion of the tongue portion 122 received by the receiving portion 115 so as to protrude toward the receiving portion 115. Accordingly, only the protrusion 612 of the tongue portion 122 is allowed to come into contact with the receiving portion 115. Therefore, generation of the metal powder caused by friction between the tongue portion 122 and the receiving portion 115 in association with the rotation of the lock lever 120 may be reduced.

The tongue portion 122 and the receiving portion 115 may be brought into contact with each other easily at a moderate pressure by the protrusion 612. Accordingly, the vibrations of the lock lever 120 with respect to the inner rail 110 may be reduced. Therefore, the vibrations of the lock lever 120 due to the vibrations in the data center or due to the transportation vibrations, for example, may be reduced.

Also, the lock lever 120 according to the configuration example 4 includes the protrusion 611 on the body portion of the lock lever 120 so as to protrude toward the inner rail 110. Accordingly, only the protrusion 611 of the body portion of the lock lever 120 may come into contact with the inner rail 110. Therefore, generation of the metal powder caused by friction between the body portion of the lock lever 120 and the inner rail 110 in association with the rotation of the lock lever 120 may be reduced.

Also, the body portion of the lock lever 120 and the inner rail 110 may be brought into contact with each other easily at a moderate pressure with the provision of the protrusion 611. Accordingly, the vibrations of the lock lever 120 with respect to the inner rail 110 may be reduced. Therefore, the vibrations of the lock lever 120 due to the vibrations in the data center or due to the transportation vibrations, for example, may be reduced.

In the configuration illustrated in FIGS. 6A to 6D, a configuration in which either one of the protrusion 611 of the body portion of the lock lever 120 and the protrusion portion 612 of the tongue portion 122 of the lock lever 120 is omitted is also applicable.

Configuration Example 5

Portions of the slide rail 100 according to the embodiment in a configuration example 5 different from those of the slide rail 100 in the configuration example 2 will be described.

Figure 7A:
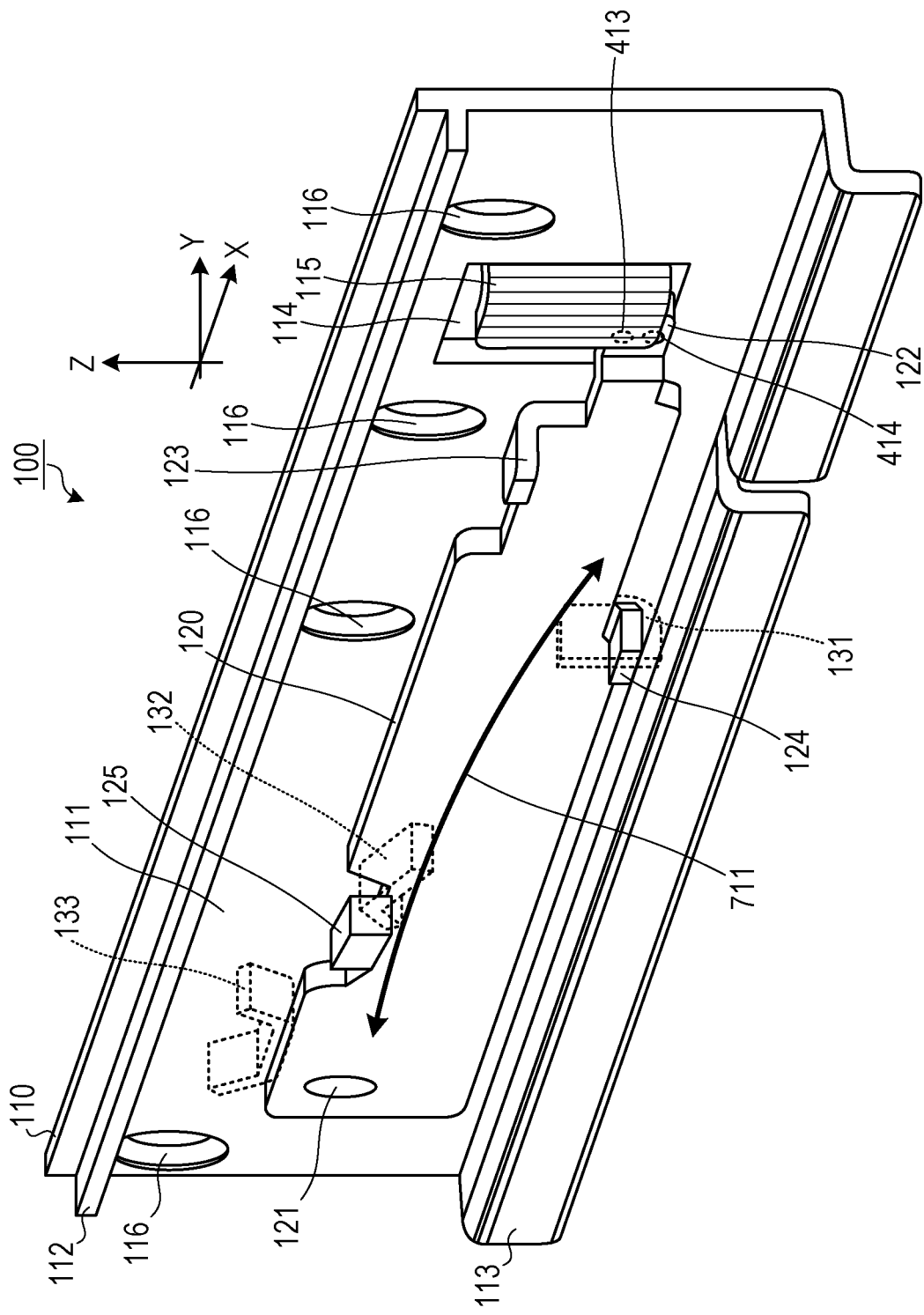
FIG. 7A is a perspective view of a configuration example 5 of the slide rail according to the embodiment.

FIG. 7A is a perspective view illustrating the configuration example 5 of the slide rail according to an embodiment. In FIG. 7A, the same portions as those illustrated in FIG. 4A are denoted by the same reference numerals and description will be omitted. The lock lever 120 according to the configuration example 5 is curved so as to project on the side of the inner rail 110 as illustrated by a double-headed arrow 711. The surface of the tongue portion 122 of the lock lever 120 on the side of the receiving portion 115 is provided with the projecting portions 413 and 414. Accordingly, the lock lever 120 becomes a state in which only part (the portion of the rotating shaft 121) of the body portion and the projecting portions 413 and 414 come into contact with the inner rail 110.

Figure 7B:
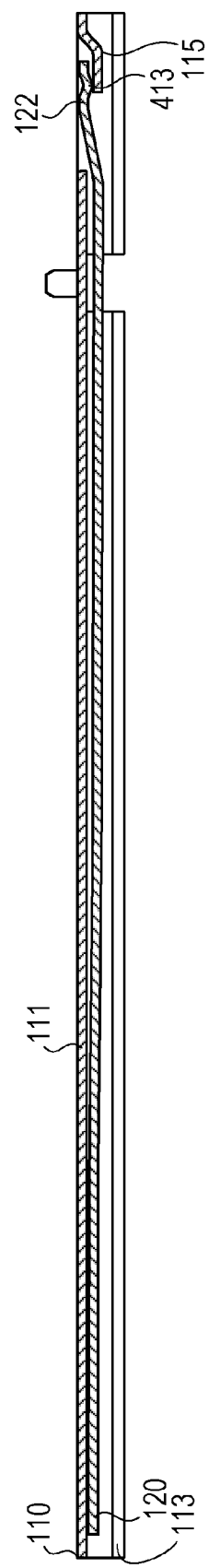
FIG. 7B is a cross-sectional view of the slide rail illustrated in FIG. 7A when viewed from the Z-axis direction.
Figure 7C:
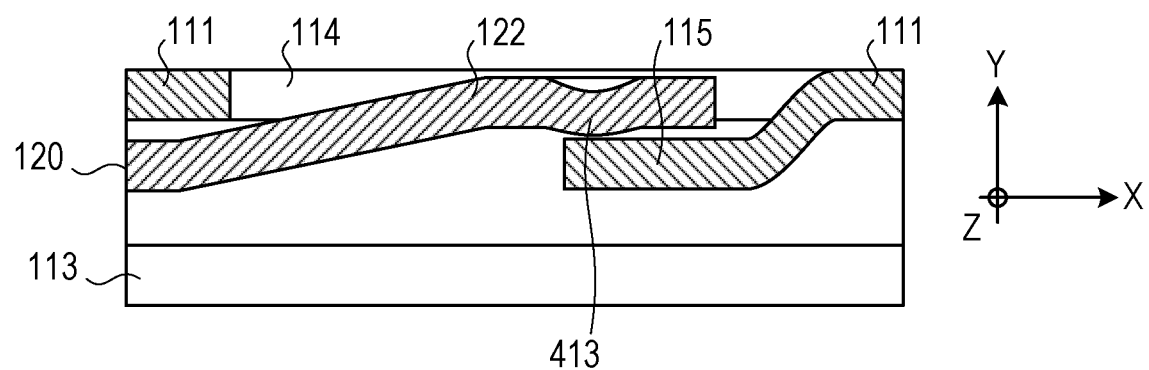
FIG. 7C is a cross-sectional view of the tongue portion of the lock lever illustrated in FIG. 7A when viewed from the Z-axis direction.

FIG. 7B is a cross-sectional view of the slide rail illustrated in FIG. 7A when viewed from the Z-axis direction. FIG. 7C is a cross-sectional view of the tongue portion of the lock lever illustrated in FIG. 7A when viewed from the Z-axis direction.

In this manner, the lock lever 120 according to the configuration example 5 is curved so as to project on the side of the inner rail 110. Accordingly, only part of the body portion of the lock lever 120, that is the portion of the rotating shaft 121, may come into contact with the inner rail 110. Therefore, generation of the metal powder caused by friction between the body portion of the lock lever 120 and the inner rail 110 in association with the rotation of the lock lever 120 is reduced.

Also, the body portion of the lock lever 120 and the inner rail 110 may be brought into contact with each other easily with a moderate pressure by the body portion of the lock lever 120 being in contact with the inner rail 110 only partly (the portion of the rotating shaft 121). Accordingly, the vibrations of the lock lever 120 with respect to the inner rail 110 may be reduced. Therefore, the vibrations of the lock lever 120 due to the vibrations in the data center or due to the transportation vibrations, for example, may be reduced.

Although the configuration in which the projecting portions 413 and 414 are provided on the surface of the tongue portion 122 of the lock lever 120 on the side of the receiving portion 115 is illustrated, a configuration in which the protrusion portion 612 is provided or a configuration in which the tape 512 is attached is also applicable instead of the projecting portions 413 and 414.

Configuration Example 6

Portions of the slide rail 100 according to the embodiment in a configuration example 6 different from those of the slide rail 100 in the configuration example 1 will be described.

Figure 8:
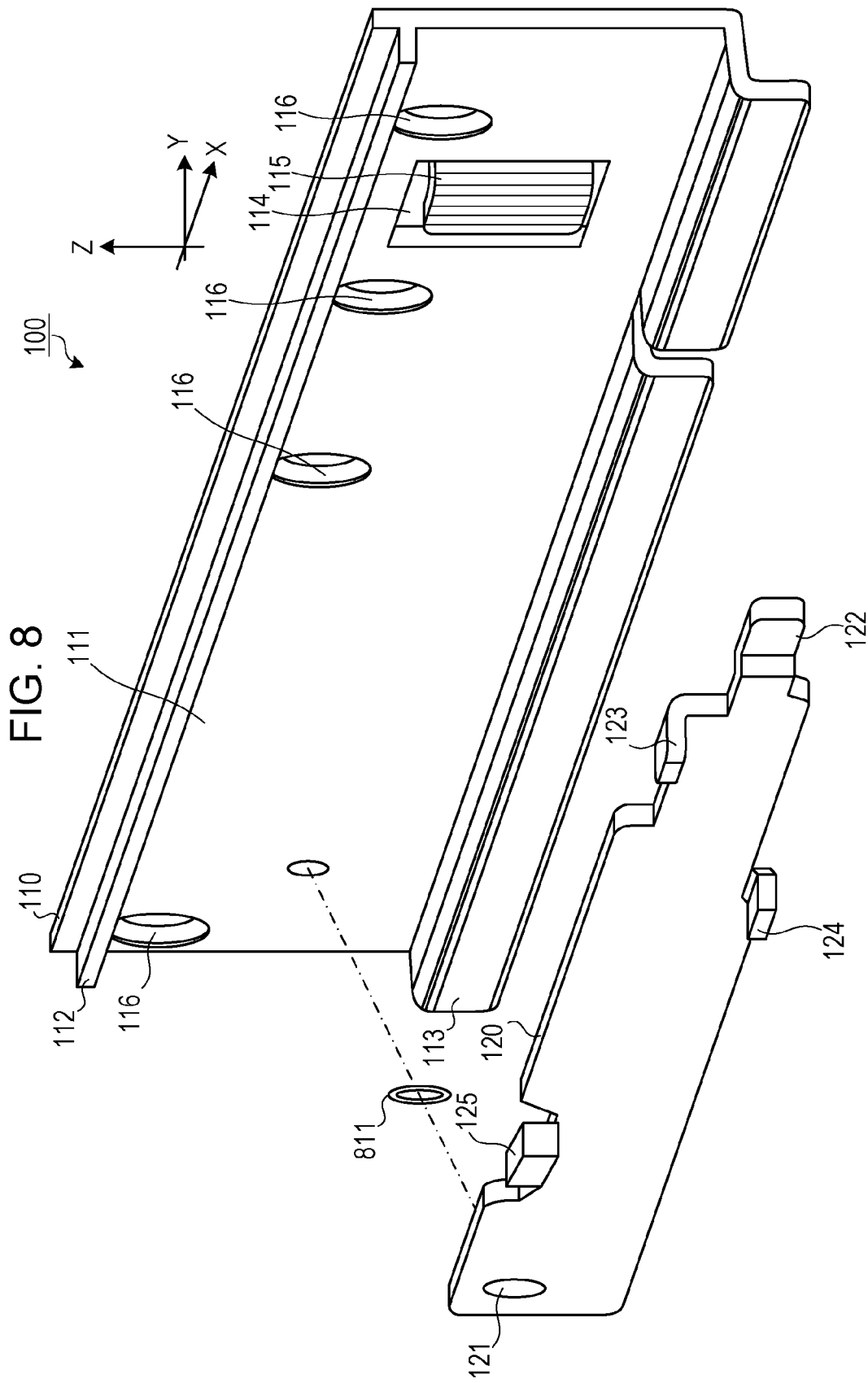
FIG. 8 is a perspective view illustrating a configuration example 6 of the slide rail according to the embodiment.

FIG. 8 is a perspective view illustrating the configuration example 6 of the slide rail according to the embodiment. In FIG. 8, the same portions as those illustrated in FIG. 1A are denoted by the same reference numerals and description will be omitted. As illustrated in FIG. 8, the lock lever 120 according to the configuration example 6 is provided on the inner rail 110 via a wave-shaped washer 811 or wave washer 811 surrounding the rotating shaft 121. Accordingly, the lock lever 120 may come into contact with inner rail 110 via the wave-shaped washer 811. Therefore, generation of the metal powder caused by friction between the body portion of the lock lever 120 and the inner rail 110 in association with the rotation of the lock lever 120 may be reduced.

The lock lever 120 may be provided easily at a moderate pressure with respect to the inner rail 110 with the provision of the wave-shaped washer 811. Accordingly, the vibrations of the lock lever 120 with respect to the inner rail 110 may be reduced. Therefore, the vibrations of the lock lever 120 due to the vibrations in the data center or due to the transportation vibrations, for example, may be reduced.

Configuration Example 7

Portions of the slide rail 100 according to the embodiment in a configuration example 7 different from those of the slide rail 100 in the configuration example 1 will be described.

FIG. 9A is a perspective view illustrating the configuration example 7 of the slide rail according to the embodiment. In FIG. 9A, the same portions as those illustrated in FIG. 1A are denoted by the same reference numerals and description will be omitted. FIG. 9B is a cross-sectional view of the slide rail illustrated in FIG. 9A when viewed from the X-axis direction.

As illustrated in FIG. 9A and FIG. 9B, the lock lever 120 according to the configuration example 7 is chamfered at a portion received by the receiving portion 115 of the tongue portion 122. Accordingly, generation of metal powder caused by friction between a corner of the tongue portion 122 and the receiving portion 115 in association with the rotation of the lock lever 120 may be reduced. R-chamfering or C-chamfering, for example, may be applied as chamfering of the tongue portion 122.

Configuration Example 8

Portions of the slide rail 100 according to the embodiment in a configuration example 8 different from those of the slide rail 100 in the configuration example 1 will be described.

Figure 10A:
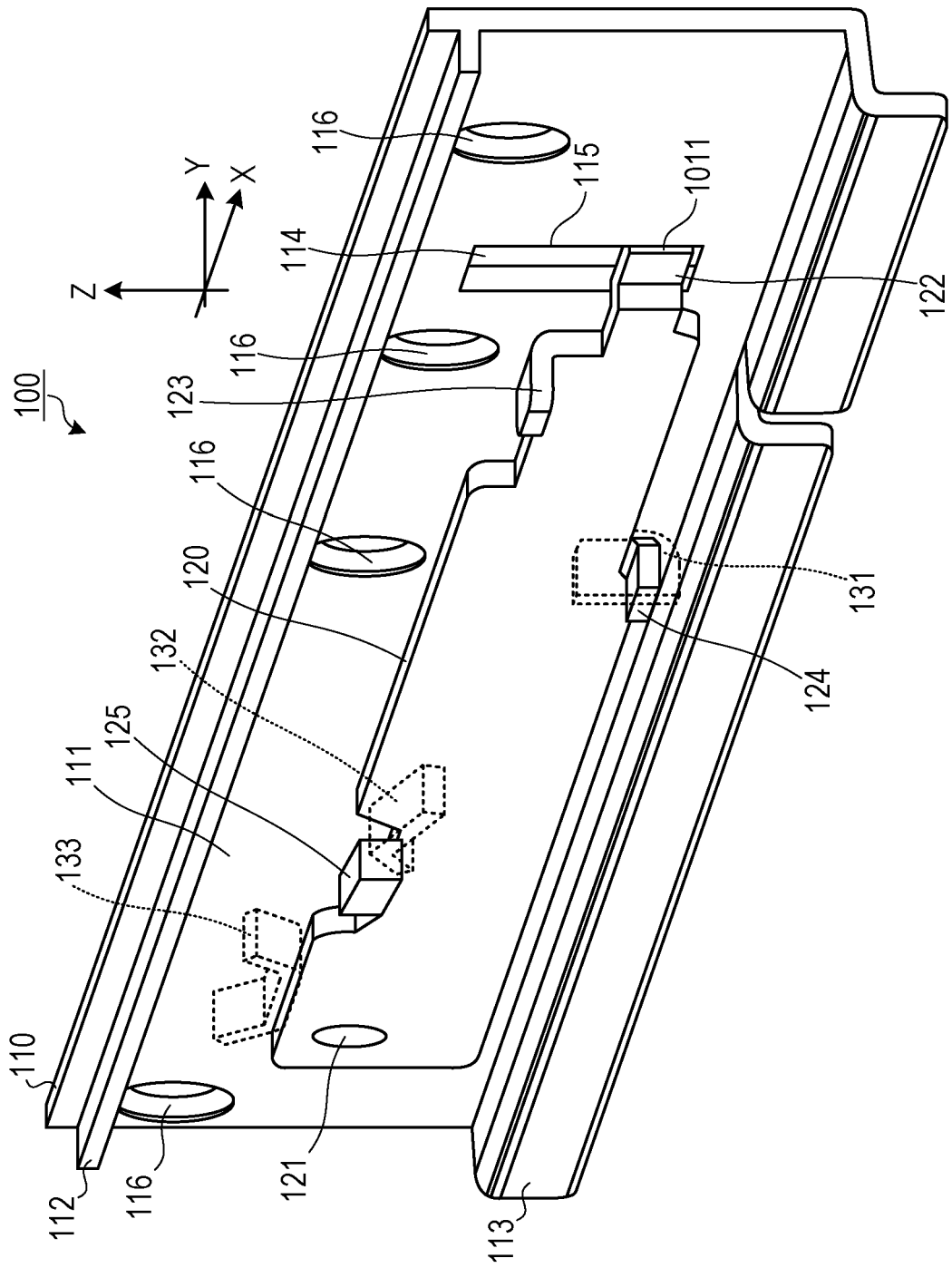
FIG. 10A is a perspective view illustrating a configuration example 8 of the slide rail according to the embodiment.
Figure 10C:
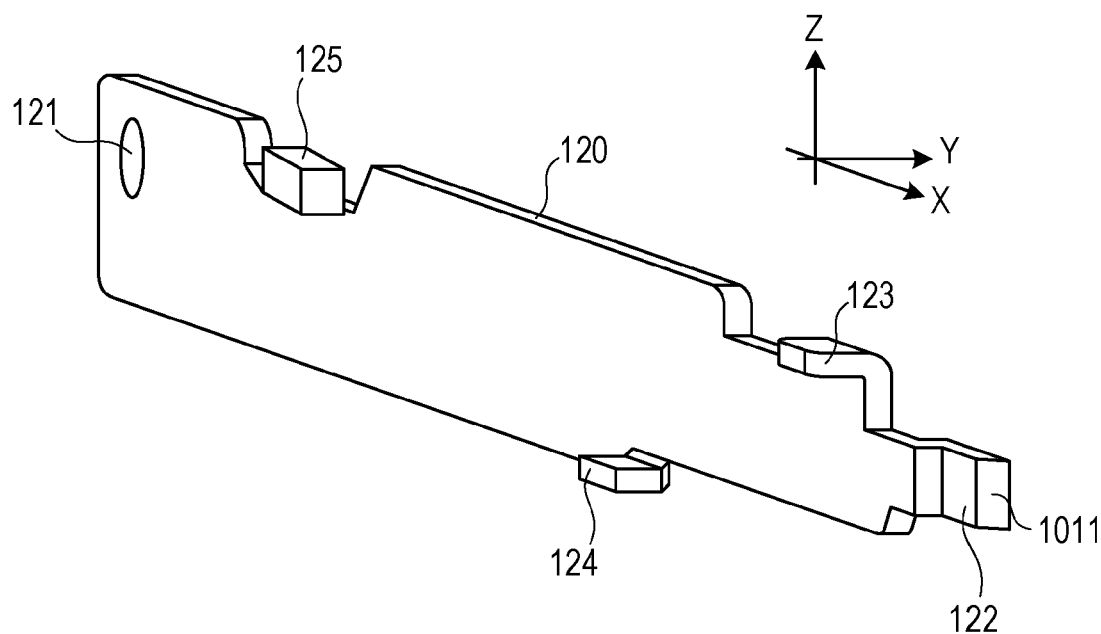
FIG. 10C is a perspective view of the lock lever illustrated in FIG. 10A.
Figure 10D:
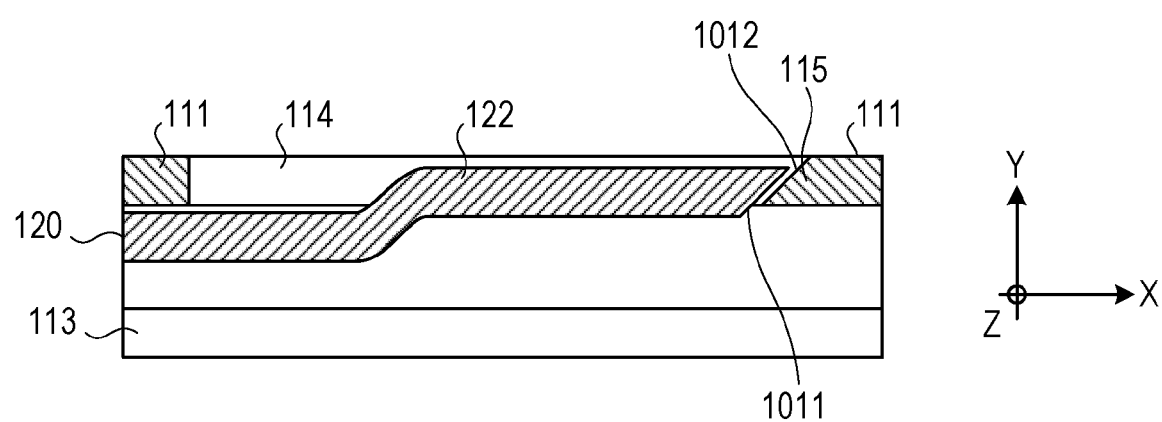
FIG. 10D is a cross-sectional view of the tongue portion and the receiving portion illustrated in FIG. 10A.

FIG. 10A is a perspective view illustrating the configuration example 8 of a slide rail according to the embodiment. FIG. 10B is a perspective view of the inner rail illustrated in FIG. 10A. FIG. 10C is a perspective view of the lock lever illustrated in FIG. 10A. FIG. 10D is a cross-sectional view of the tongue portion and the receiving portion illustrated in FIG. 10A viewed from the Z-axis direction. In FIGS. 10A to 10D, the same portions as those illustrated in FIGS. 1A to 1D are denoted by the same reference numerals and description will be omitted.

As illustrated in FIGS. 10A to 10D, a distal end of the tongue portion 122 of the lock lever 120 according to the configuration example 8 is provided with an inclined surface 1011 extending to the opposite side of the outer rail 130 as it goes toward the distal end of the tongue portion 122. Then, the receiving portion 115 includes an inclined surface 1012 parallel to the inclined surface 1011, and receives the inclined surface 1011 by the inclined surface 1012. Accordingly, opening of the lock lever 120 with respect to the inner rail 110 may be reduced while further reducing protrusion of the receiving portion 115 in the Y-axis minus direction.

Figure 11C:
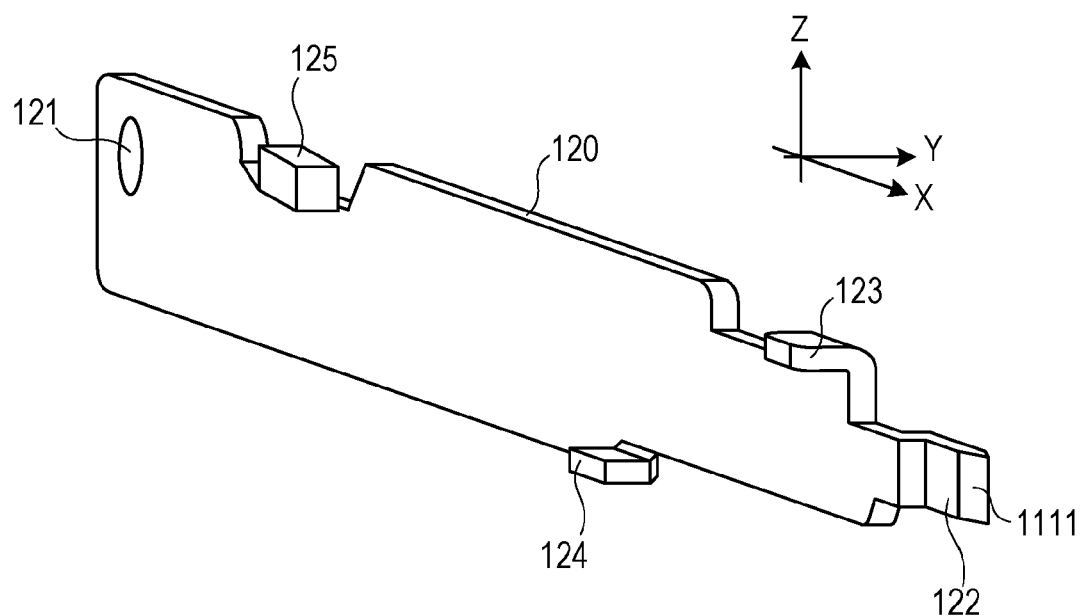
FIG. 11C is a perspective view of the lock lever illustrated in FIG. 11A.
Figure 11D:
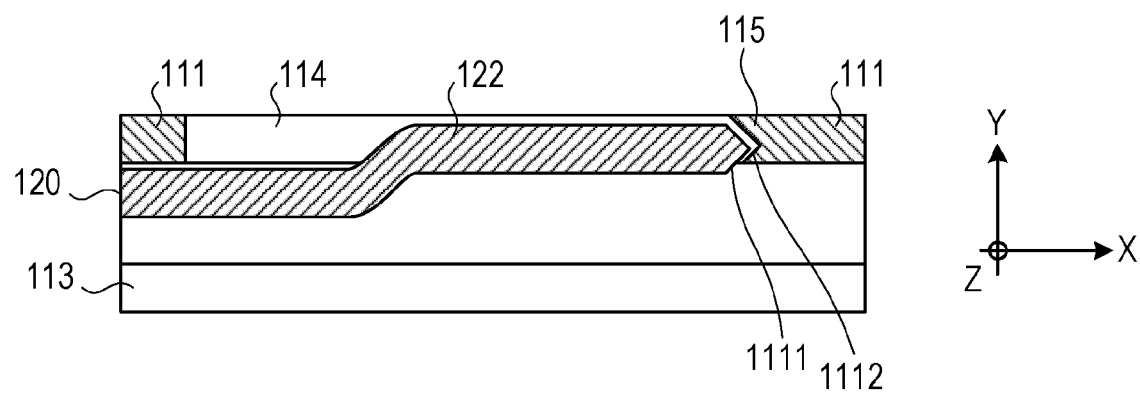
FIG. 11D is a cross-sectional view of the tongue portion and the receiving portion illustrated in FIG. 11A.

FIG. 11A is a perspective view illustrating a modification of the slide rail illustrated in FIG. 10A. FIG. 11B is a perspective view of the inner rail illustrated in FIG. 11A. FIG. 11C is a perspective view of the lock lever illustrated in FIG. 11A. FIG. 11D is a cross-sectional view of the tongue portion and the receiving portion illustrated in FIG. 11A viewed from the Z-axis direction. In FIGS. 11A to 11D, the same portions as those illustrated in FIGS. 1A to 1D are denoted by the same reference numerals and description will be omitted.

As illustrated in FIGS. 11A to 11D, a distal end portion of the tongue portion 122 of the lock lever 120 according to the configuration example 8 may be formed into a wedge shape. A distal end of the wedge-shaped tongue portion 122 of the lock lever 122 includes an inclined surface 1111 extending to the opposite side of the outer rail 130 as it goes toward the distal end of the tongue portion 122. The receiving portion 115 is formed into a depressed shape corresponding to the wedge shape of the distal end of the tongue portion 122. A portion of the depressed shape of the receiving portion 115 includes an inclined surface 1112 parallel to the inclined surface 1111 of the tongue portion 122. The receiving portion 115 receives the inclined surface 1111 of the tongue portion 122 by the inclined surface 1112. Accordingly, opening of the lock lever 120 with respect to the inner rail 110 may be reduced while further reducing protrusion of the receiving portion 115 in the Y-axis minus direction.

Configuration Example 9

Portions of the slide rail 100 according to the embodiment in a configuration example 9 different from those of the slide rail 100 in the configuration example 1 will be described.

Figure 12A:
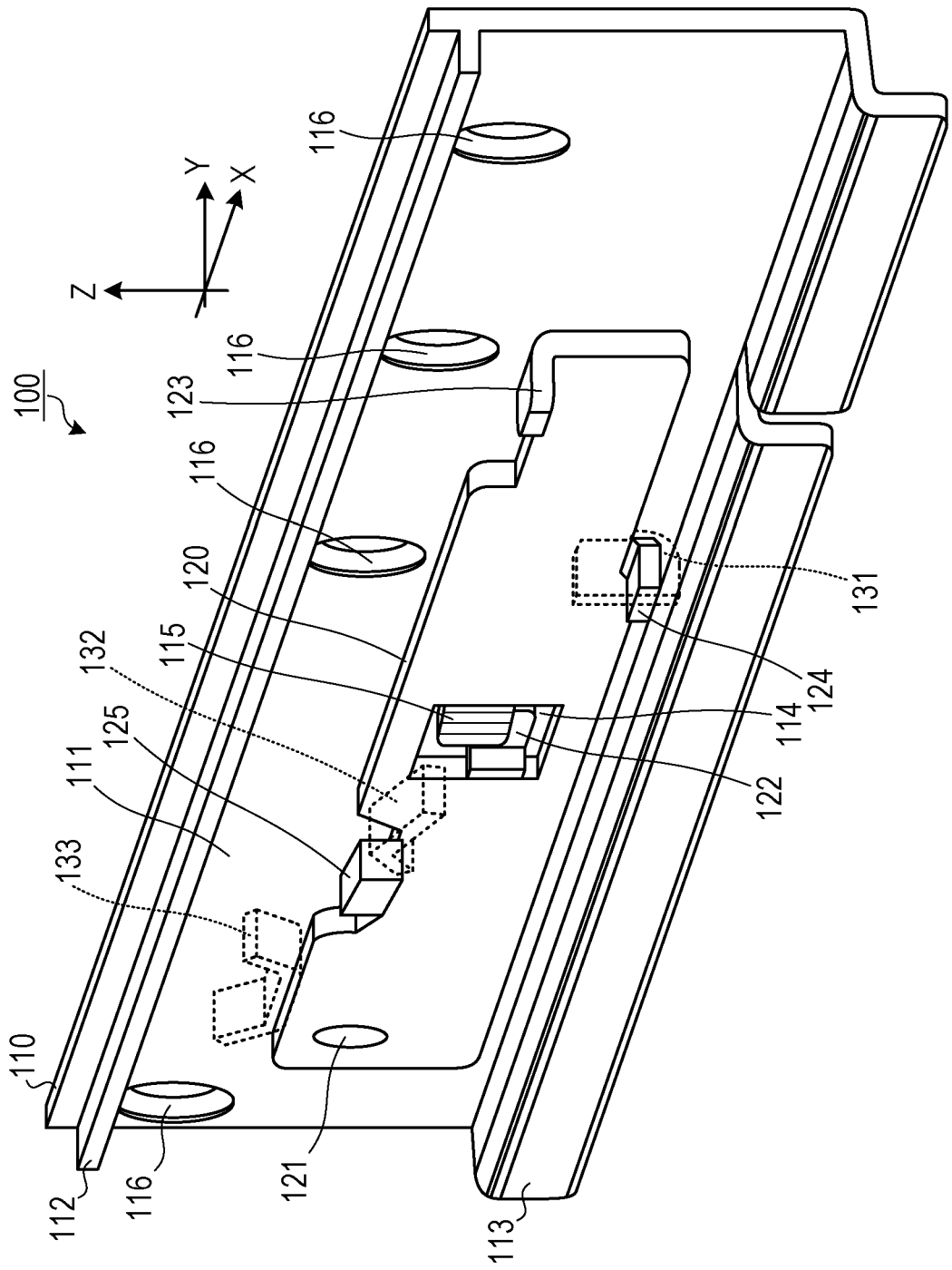
FIG. 12A is a perspective view illustrating a configuration example 9 of the slide rail according to the embodiment.
Figure 12C:
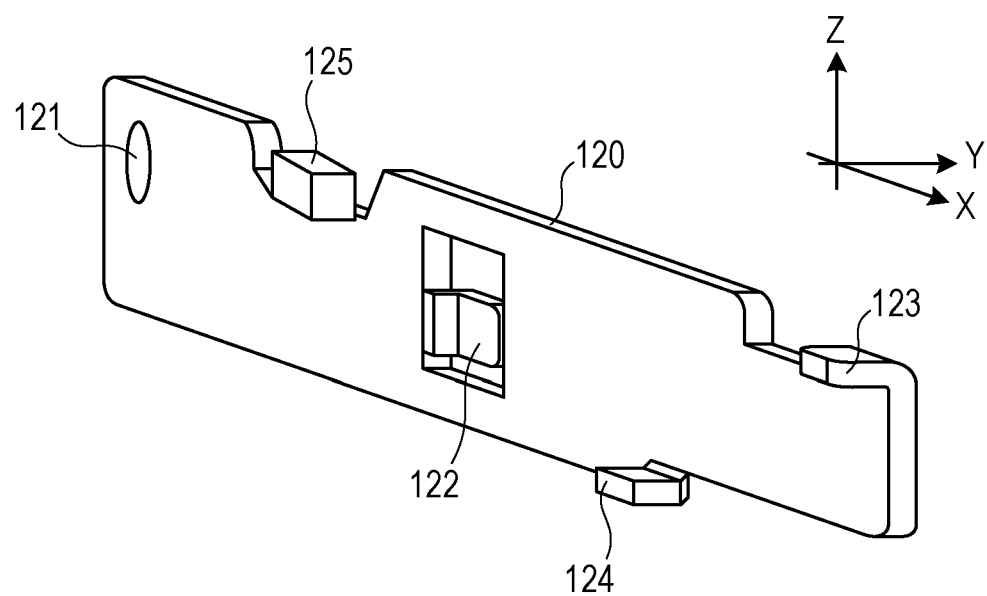
FIG. 12C is a perspective view of the lock lever illustrated in FIG. 12A.

FIG. 12A is a perspective view illustrating the configuration example 9 of the slide rail according to the embodiment. FIG. 12B is a perspective view of the inner rail illustrated in FIG. 12A. FIG. 12C is a perspective view of the lock lever illustrated in FIG. 12A. In FIGS. 12A to 12C, the same portions as those illustrated in FIGS. 1A to 1C are denoted by the same reference numerals and description will be omitted.

As illustrated in FIGS. 12A to 12C, the tongue portion 122 of the lock lever 120 according to the configuration example 9 is provided between a position on the lock lever 120 farthest from the rotating shaft 121 and the rotating shaft 121, that is, provided in the vicinity of the center of the lock lever 120. Accordingly, the range of displacement of the tongue portion 122 in association with the rotation of the lock lever 120 may be reduced. Therefore, since the hole portion 114 may be reduced, for example, flexibility of the design of the inner rail 110 may be improved.

Configuration Example 10

Portions of the slide rail 100 according to the embodiment in a configuration example 10 different from those of the slide rail 100 in the configuration example 9 will be described.

Figure 13A:
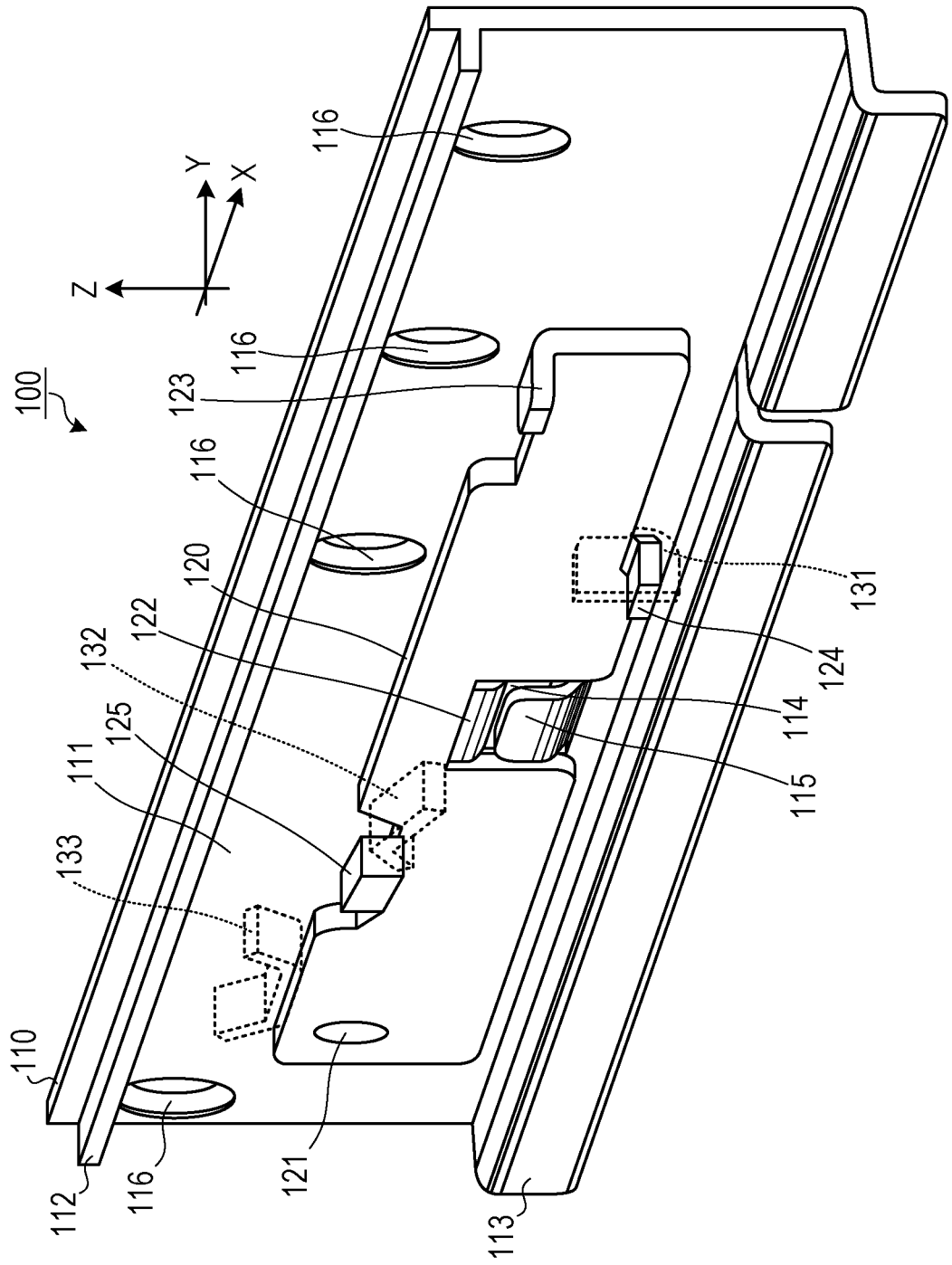
FIG. 13A is a perspective view illustrating a configuration example 10 of the slide rail according to the embodiment.
Figure 13C:
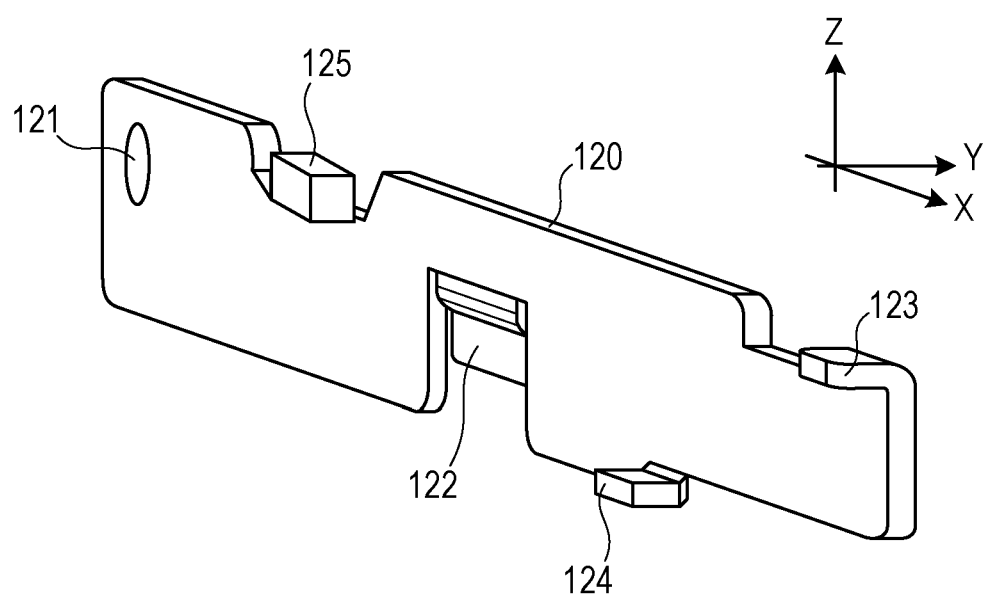
FIG. 13C is a perspective view of the lock lever illustrated in FIG. 13A.

FIG. 13A is a perspective view illustrating the configuration example 10 of the slide rail according to the embodiment. FIG. 13B is a perspective view of the inner rail illustrated in FIG. 13A. FIG. 13C is a perspective view of a lock lever illustrated in FIG. 13A. In FIGS. 13A to FIG. 13C, the same portions as those illustrated in FIGS. 12A to 12C are denoted by the same reference numerals and description will be omitted.

As illustrated in FIGS. 13A to 13C, the tongue portion 122 of the configuration example 10 is formed into a crank shape bent toward the hole portion 114 and bent further in the direction of displacement, or a vertical direction, of the tongue portion 122 caused by the rotation of the lock lever 120 in the directions parallel to the inner rail 110. In this configuration as well, while an increase in thickness of the slide rail 100 is suppressed, the degree of opening of the lock lever 120 with respect to the inner rail 110 may be reduced.

(Operation when Removing Inner Rail)

FIGS. 14A to 14E are drawings illustrating an example of an operation to be performed when the inner rail is removed. In FIG. 14A to 14E, the same portions as those illustrated in FIG. 1A are respectively denoted by the same reference numerals and description will be omitted. In FIG. 14A to 14E, the outer rail 130 is not illustrated entirely, and only the stopper 131, the lever push-up portion 132, and the lever push-down portion 133 of the outer rail 130 are illustrated by dot-lines.

Figure 14A:
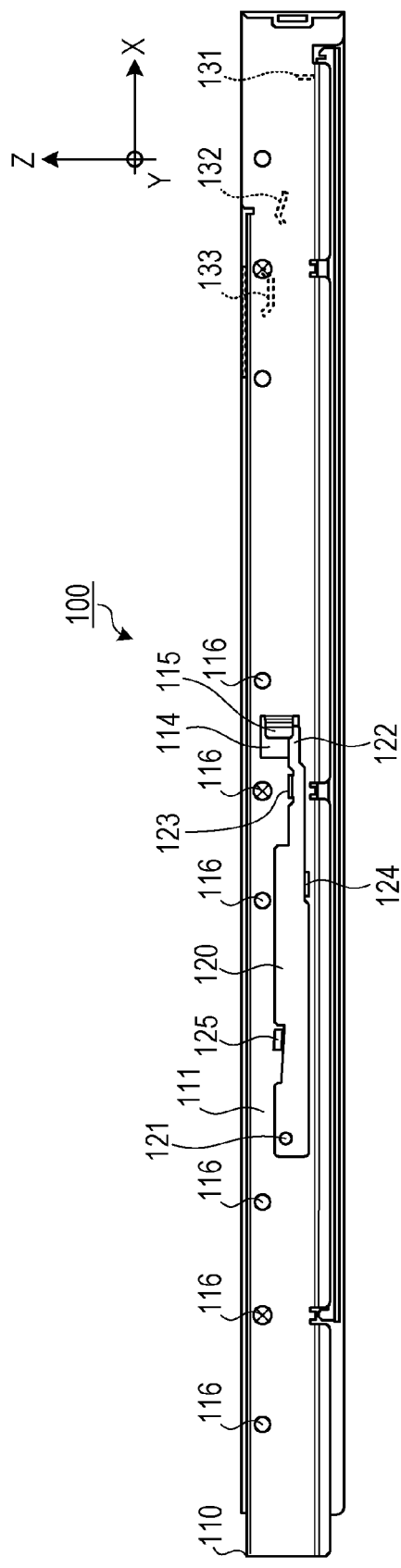
FIG. 14A is a (first) drawing illustrating an example of an operation to be performed when removing the slide rail.
Figure 14B:
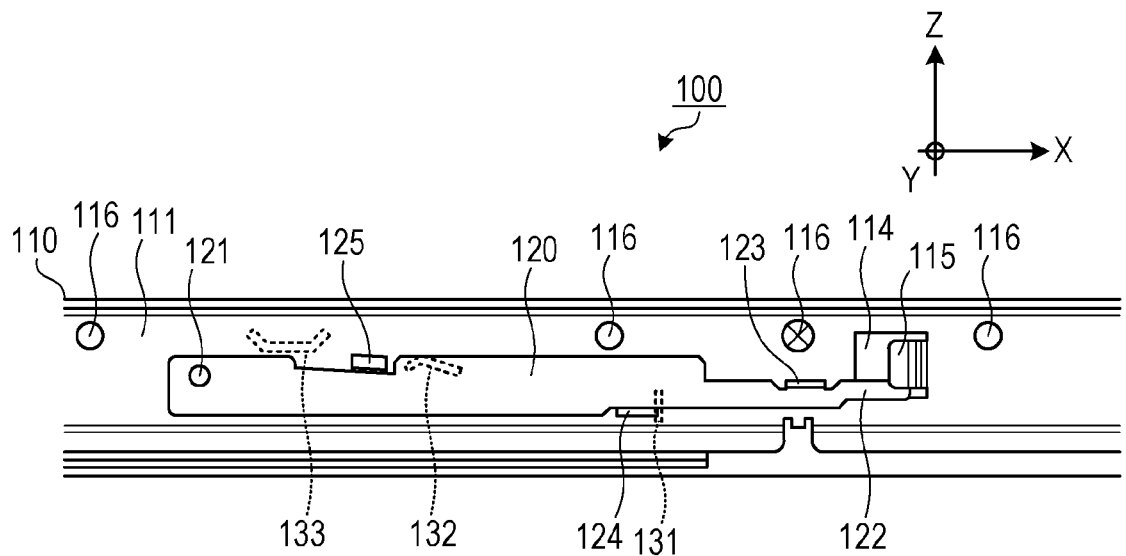
FIG. 14B is a (second) drawing illustrating the example of the operation to be performed when removing the slide rail.

FIG. 14A illustrates a state in which the inner rail 110 is inserted to the back of the outer rail 130. In the state illustrated in FIG. 14A, the lock lever 120 is lowered. In the state of illustrated in FIG. 14A, when the inner rail 110 is pulled out from the outer rail 130 to the predetermined position, since the lock lever 120 is lowered, the abutting portion 124 abuts against the stopper 131 as illustrated in FIG. 14B. Therefore, the inner rail 110 resists from being pulled out further from the outer rail 130.

Figure 14C:
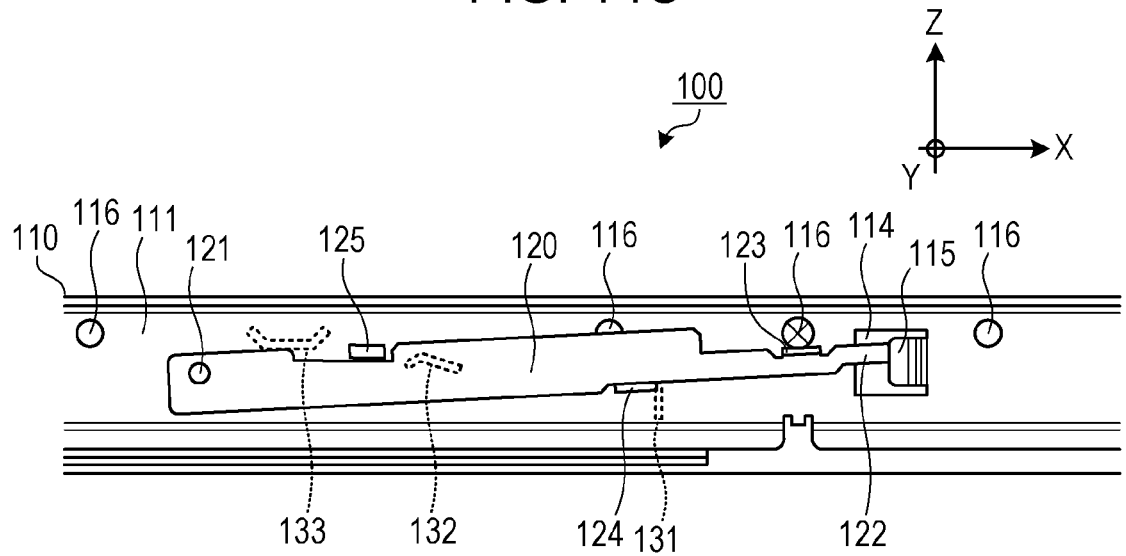
FIG. 14C is a (third) drawing illustrating the example of the operation to be performed when removing the slide rail.

Subsequently, when the operator pulls the lock lever 120 upward by the operating portion 123, as illustrated in FIG. 14C, the abutting portion 124 is positioned at a level higher than the stopper 131, and a state in which the inner rail 110 may be pulled out from the outer rail 130 is achieved.

Figure 14D:
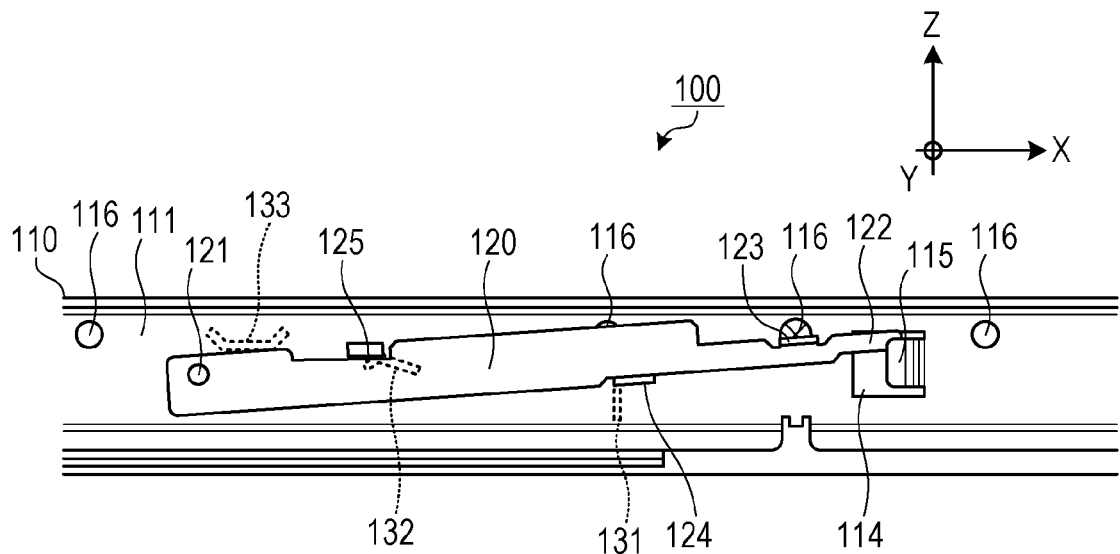
FIG. 14D is a (fourth) drawing illustrating the example of the operation to be performed when removing the slide rail.

In a state illustrated in FIG. 14C, when the inner rail 110 is pulled out from the outer rail 130, the push up/down operating portion 125 is brought into a state of riding on the lever push-up portion 132 as illustrated in FIG. 14D. Accordingly, the inner rail 110 does not move downward even when the operator releases the operating portion 123, and a state in which the inner rail 110 may be pulled out from the outer rail 130 is maintained.

In this manner, the lever push-up portion 132 of the outer rail 130 functions as a guide portion configured to guide the position of the lock lever 120. Specifically, the lever push-up portion 132 becomes a state in which the push up/down operating portion 125 rests thereon when the inner rail 110 is pulled out to the predetermined position in a state in which the abutting portion 124 is on the side of the X-axis minus direction with respect to the stopper 131 and the lock lever 120 is located in the second area (on the side of the Z-axis plus direction). Then, the lock lever 120 is held in the second area until the inner rail 110 is further pulled out and the abutting portion 124 is displaced on the side of the X-axis plus direction with respect to the stopper 131.

Accordingly, the operator is capable of pulling out the inner rail 110 as is only by pulling out the inner rail 110 to the predetermined position in a state in which the lock lever 120 is lifted up by the operating portion 123 without performing the operation of the lock lever 120 thereafter. Therefore, the operation to pull out the inner rail 110 may be facilitated while achieving a locking function which resists the inner rail 110 from being pulled out without lifting the lock lever 120.

Figure 14E:
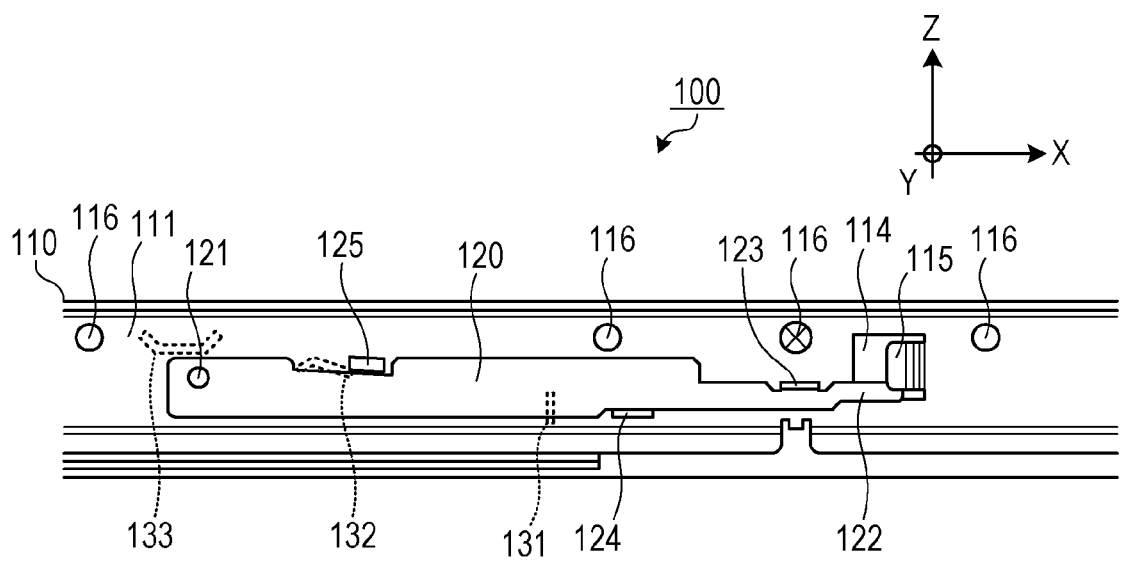
FIG. 14E is a (fifth) drawing illustrating the example of the operation to be performed when removing the slide rail.

In the state illustrated in FIG. 14D, when the inner rail 110 is pulled out further from the outer rail 130, the abutting portion 124 moves beyond the stopper 131, and then the push up/down operating portion 125 moves beyond the lever push-up portion 132 as illustrated in FIG. 14E. Consequently, the push up/down operating portion 125 moves downward from the lever push-up portion 132 by a gravitational force, and the lock lever 120 is moved downward. From then onward, since the abutting portion 124 is located beyond the stopper 131, the inner rail 110 is allowed to be pulled out from the outer rail 130 and to be removed therefrom.

(Operation when Inserting Inner Rail)

Figure 15A:
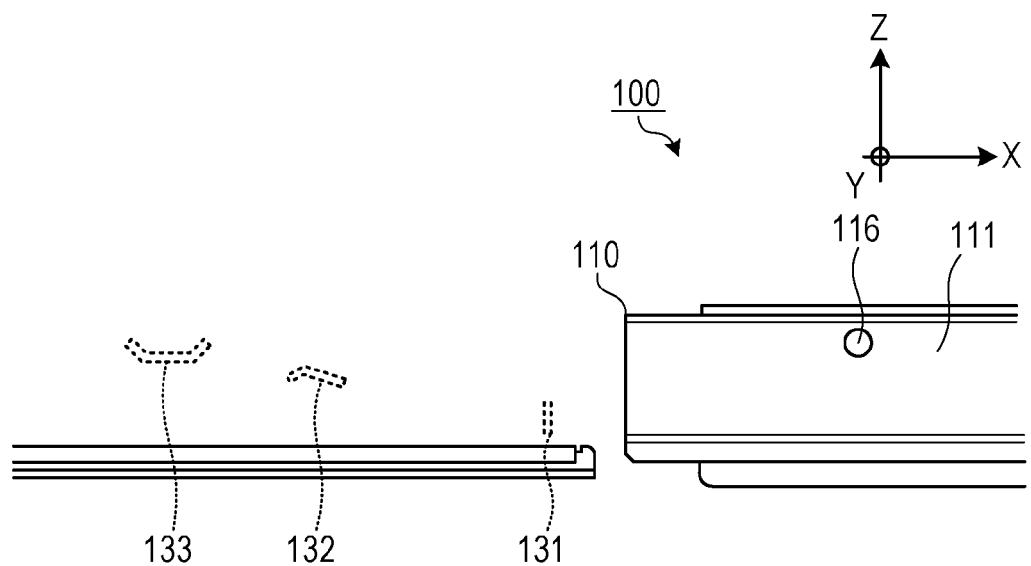
FIG. 15A is a (first) drawing illustrating an example of an operation to be performed when inserting the slide rail.
Figure 15B:
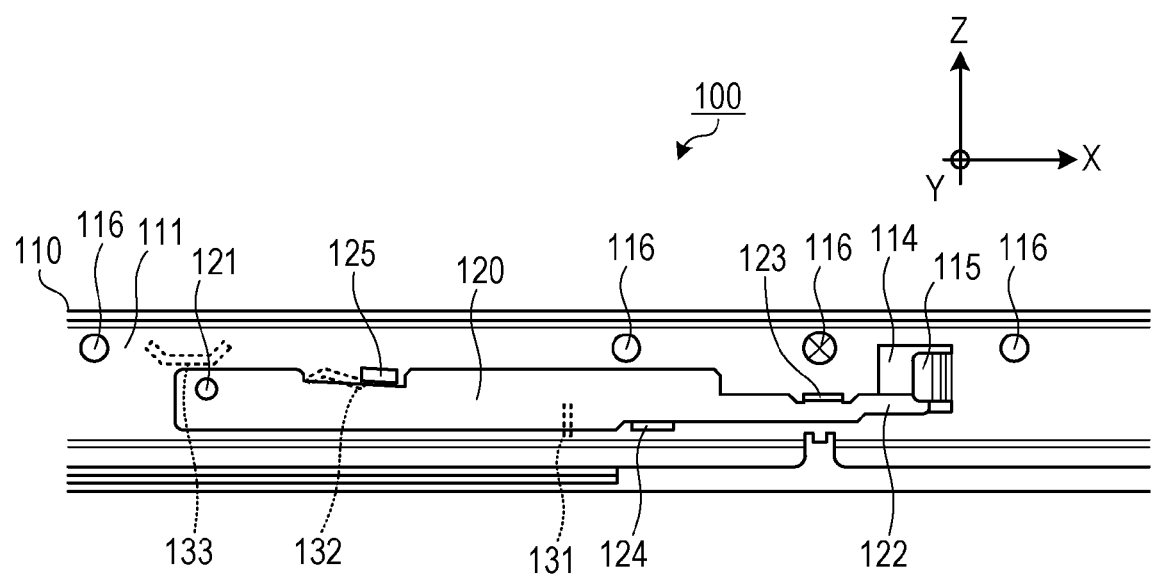
FIG. 15B is a (second) drawing illustrating the example of the operation to be performed when inserting the slide rail.
Figure 15C:
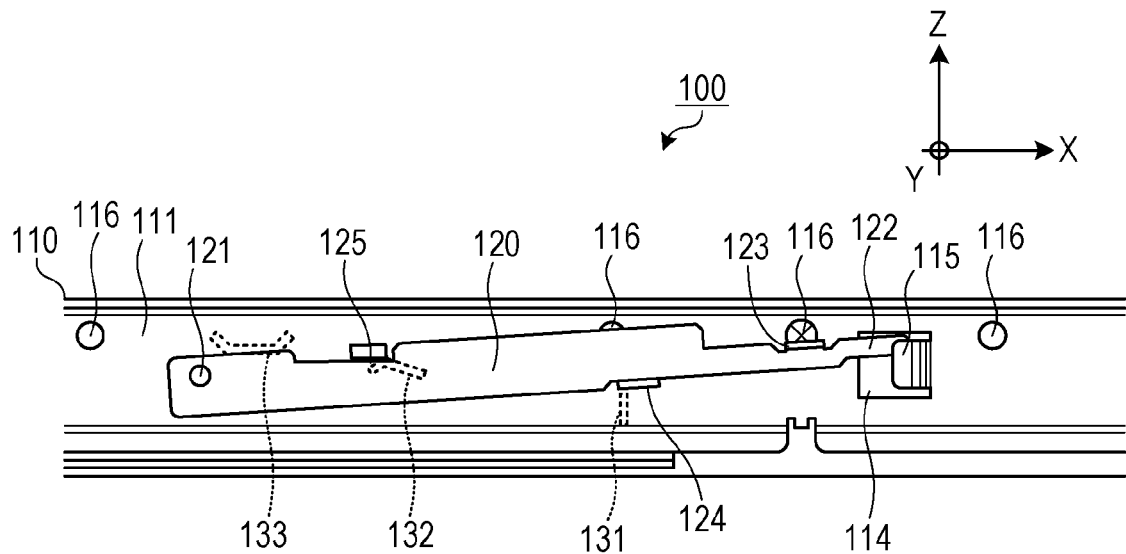
FIG. 15C is a (third) drawing illustrating an example of the operation to be performed when inserting the slide rail.
Figure 15D:
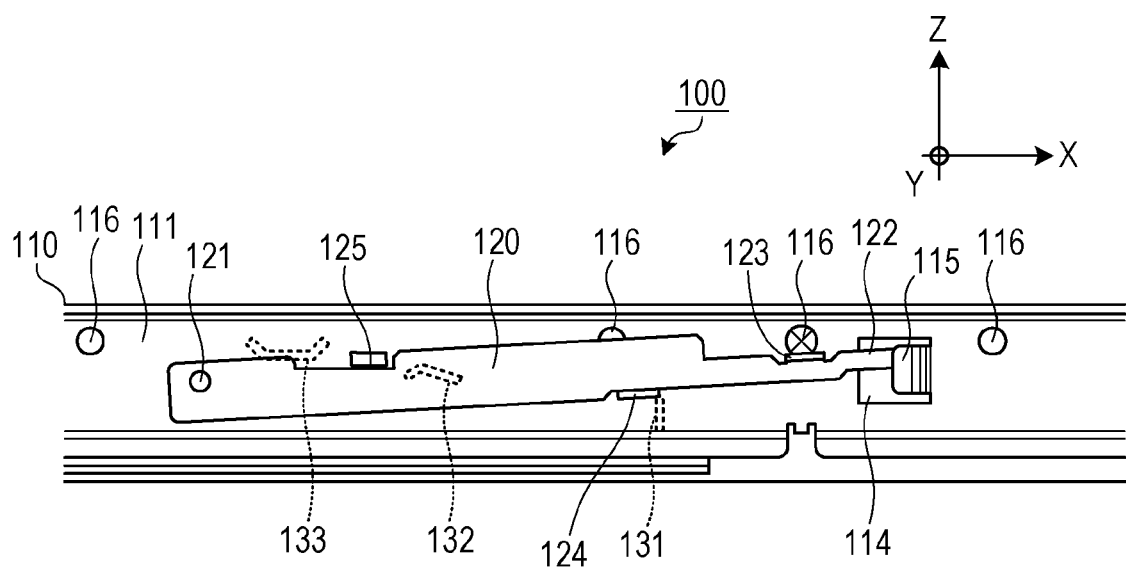
FIG. 15D is a (fourth) drawing illustrating the example of the operation to be performed when inserting the slide rail.
Figure 15E:
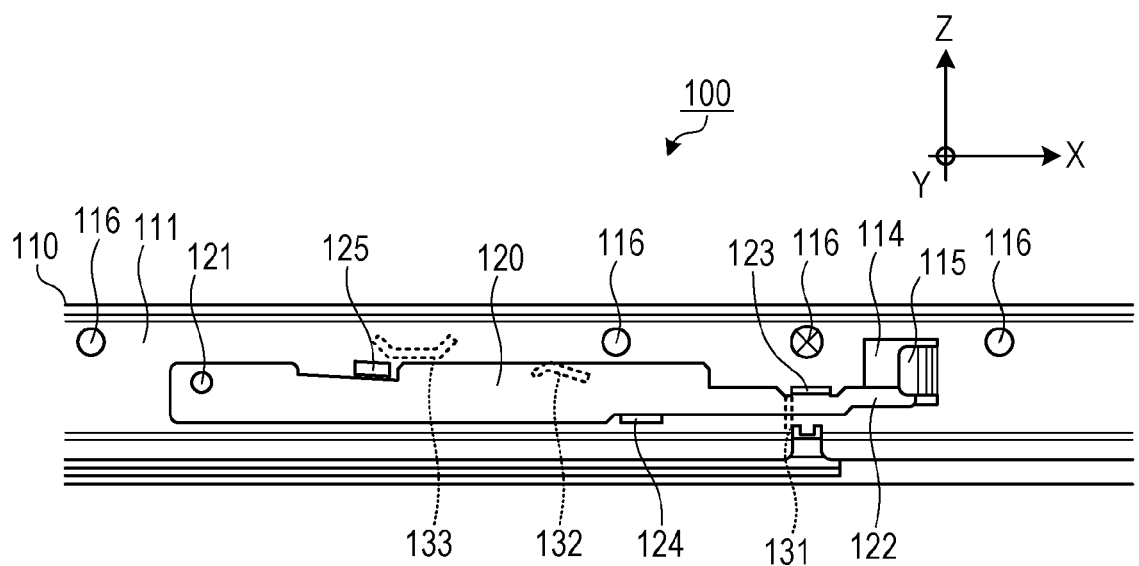
FIG. 15E is a (fifth) drawing illustrating the example of the operation to be performed when inserting the slide rail.

FIGS. 15A to 15E are drawing illustrating an example of an operation to be performed when inserting the inner rail. In FIGS. 15A and 15E, the same portions as those illustrated in FIGS. 14A to 14E are denoted respectively by the same reference numerals and description will be omitted. In FIGS. 15A to 15E, the outer rail 130 is not illustrated entirely, and only the stopper 131, the lever push-up portion 132, and the lever push-down portion 133 of the outer rail 130 are illustrated by dot-lines.

FIG. 15A illustrates a state in which the inner rail 110 is removed from the outer rail 130. In the state illustrated in FIG. 15A, the lock lever 120 is lowered. In the state illustrated in FIG. 15A, when the inner rail 110 is pushed into the outer rail 130, as illustrated in FIG. 15B, the push up/down operating portion 125 rests on the lever push-up portion 132 before the abutting portion 124 abuts against the stopper 131. Accordingly, the operator is allowed to push the inner rail 110 into the outer rail 130 even though the lock lever 120 is not lifted by the operating portion 123.

In the state illustrated in FIG. 15B, when the inner rail 110 is pushed further into the outer rail 130, the abutting portion 124 moves beyond the stopper 131 as illustrated in FIG. 15C and FIG. 15D. Also, since the push up/down operating portion 125 moves beyond the lever push-up portion 132, the lock lever 120 is allowed to move downward.

In this manner, when the inner rail 110 is pushed in a state in which the abutting portion 124 is located on the side of the X-axis plus direction with respect to the stopper 131 and the lock lever 120 is located in the first area (on the side of the Z-axis minus direction), the lever push-up portion 132 pushes the push up/down operating portion 125 upward. Accordingly, the lock lever 120 may be displaced to the second area (on the side of the Z-axis plus direction). Then, when the inner rail 110 is pushed further inward, the lever push-up portion 132 holds the lock lever 120 in the second area until the abutting portion 124 is displaced to the side of the X-axis minus direction with respect to the stopper 131.

Accordingly, the operator is allowed to push the inner rail 110 into the outer rail 130 even though the operation for lifting the lock lever 120 is not performed by the operating portion 123. Therefore, the operation for pushing inner rail 110 into the outer rail 130 may be facilitated while achieving the locking function which resists the inner rail 110 from being pulled out without lifting the lock lever 120.

In a state illustrated in FIG. 15D, the lock lever 120 is assumed to be kept in a lifted position due to the friction or the like between the inner rail 110 and the lock lever 120. In the state illustrated in FIG. 15D, when the inner rail 110 is pushed further inward of the outer rail 130, the push up/down operating portion 125 is pushed downward by the lever push-down portion 133 as illustrated in FIG. 15E, and then the lock lever 120 moves downward. Accordingly, in the same manner as the state illustrated in FIG. 14B, a state in which the inner rail 110 resists from being pulled out from the outer rail 130 (locked state) is achieved unless the operator lift the lock lever 120.

Therefore, the probability that the lock lever 120 is kept in a state of being lifted (unlocked state) may be reduced even though the operator does not perform the operation to move the lock lever 120 downward when the inner rail 110 is inserted into the outer rail 130.

There is a case where the lock lever 120 is lifted by the vibrations of the lock lever 120 or the like due to the vibrations in the data center or the transportation vibrations after the inner rail 110 is inserted into the back of the outer rail 130 (see FIG. 14A). In this case as well, when the inner rail 110 is pulled out from the outer rail 130, the lock lever 120 moves downward by the push up/down operating portion 125 being pushed downward by the lever push-down portion 133. Therefore, in the same manner as the state illustrated in FIG. 14B, a state in which the inner rail 110 is not allowed to be pulled out from the outer rail 130 (locked state) is achieved unless the operator lift the lock lever 120.

In this manner, the lever push-down portion 133 of the outer rail 130 functions as the guide portion configured to guide the position of the lock lever 120. Specifically, the lever push-down portion 133 pushes the push up/down operating portion 125 downward when the inner rail 110 is pushed into the predetermined position in a state in which the abutting portion 124 is on the side of the X-axis minus direction with respect to the stopper 131 and the lock lever 120 is located in the second area (on the side of the Z-axis plus direction) with respect to the stopper 131. Accordingly, the lock lever 120 may be displaced to the first area (on the side of the Z-axis minus direction).

Accordingly, the operator may move the lock lever 120 downward only by pushing the inner rail 110 further inward even through the operation to move the lock lever 120 downward is not performed after having pushed the inner rail 110 until the abutting portion 124 moves beyond the stopper 131. Accordingly, when the inner rail 110 is inserted into the outer rail 130, the locked state is automatically achieved. Therefore, the operation to push inward of the inner rail 110 may be facilitated while realizing a locking function which resists the inner rail 110 from being pulled out without lifting the lock lever 120.

As described above, with the slide rail of the embodiment the degree of opening of the lock lever may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A slide rail comprising:
    a first rail member including a guide portion, the guide portion being configured to hold or displace the lock lever;
    a second rail member provided slidably with respect to the first rail member, the second rail member including a hole portion opening at least on a surface of the second rail member on the side of the first rail member;
    a lock lever and a rotating shaft provided on the surface of second rail member on the side of the first rail member, the lock lever being provided to be able to rotate about the rotating shaft, the lock lever including a tongue potion, the tongue portion being formed so as to be inserted in the hole portion; and
    a receiving portion provided on the second rail member and configured to hold the tongue portion of the lock lever from the direction of the first rail member.

2. The slide rail according to claim 1, wherein the lock lever is configured to switch between a state in which a predetermined limit is applied to a sliding motion of the second rail member with respect to the first rail member and a state in which the predetermined limit is not applied to the sliding motion caused by the rotation about the rotating shaft.

3. The slide rail according to claim 1, wherein the lock lever is displaceable between
    a first area in which an abutting portion provided on the lock lever abut against a stopper provided on the first rail member when the second rail member is pulled out from the first rail member and
    a second area in which the abutting portion does not abut against the stopper when the second rail member is pulled out from the first rail member caused by the rotation about the axis of rotation.

4. The slide rail according to claim 3, wherein the second rail member is allowed to be pulled out from the first rail member in a predetermined pulling-out direction, and
    the guide portion holds the lock lever in the second area until the second rail member is further pulled out and the abutting portion is displaced to the side of the pulling-out direction with respect to the stopper when the second rail member is pulled out to the predetermined position in a state in which the abutting portion is located on the side opposite to the pulling-out direction with respect to the stopper and the lock lever is located in the second area.

5. The slide rail according to claim 4, wherein the second rail member is capable of being pushed into the first rail member in a direction opposite to the pulling-out direction, and
    the guide portion displaces the lock lever to the second area when the second rail member is pushed inward in a state in which the abutting portion is located on the side of the pulling-out direction with respect to the stopper and the second rail member is located in the first direction, and hold the lock lever in the second area until the abutting portion is displaced to the side opposite from the pulling-out direction with respect to the stopper.

6. The slide rail according to claim 3, wherein the second rail member is capable of being pushed into the first rail member in a predetermined push-in direction, and
    the guide portion displaces the lock lever to the first area when the second rail member is pushed into the predetermined position in a state in which the abutting portion is located on the side of the push-in direction with respect to the stopper and the lock lever is located in the second area.

7. The slide rail according to claim 1, wherein the first rail member is fixed to a rack configured to house an apparatus, and
    the second rail member is configured to grip the apparatus on a surface on the side opposite to the first rail member.

8. The side rail according to claim 1, wherein the receiving portion is not protruded to the side of the first rail member with respect to the rock lever.

9. The slide rail according to claim 1, wherein the rotation of the lock lever is limited by an opening area of the hole portion in which he tongue portion is displaceable.

10. The slide rail according to claim 1, wherein the tongue portion is formed into a crank shape bent toward the hole portion, and bent in the direction parallel to the second rail member.

11. The slide rail according to claim 10, wherein the tongue portion is formed into a crank shape bent toward the hole portion, and bent further in the direction opposite to the rotating shaft of the direction parallel to the second rail member.

12. The slide rail according to claim 1, wherein the tongue portion is provided at a position on the lock lever farthest from the rotation shaft.

13. The slide rail according to claim 1, wherein the lock lever includes a projecting portion projecting toward the receiving portion on a portion of the tongue portion received by the receiving portion.

14. The slide rail according to claim 13, wherein the lock lever is curved so as to project on the side of the second rail member.

15. The slide rail according to claim 1, wherein the lock lever includes a projecting portion projecting toward the second rail member on a portion different from the tongue portion.

16. The slide rail according to claim 1, wherein the lock lever includes a thin strip having a smooth surface on the side of the receiving portion on surface of the portion of the tongue portion received by the receiving portion on the side of the receiving portion.

17. The slide rail according to claim 1, wherein the lock lever includes a thin strip having a smooth surface on the side of the second rail member attached on surface of the portion different from the tongue portion on the side of the second rail member.

18. The slide rail according to claim 1, wherein the lock lever includes a linear protrusion protruding toward the receiving portion on a portion of the tongue portion received by the receiving portion.

19. The slide rail according to claim 1, wherein the lock lever includes a linear protrusion protruding toward the second rail member on a portion different from the tongue portion.

20. The slide rail according to claim 1, wherein the lock lever is provided on the second rail member via a wave-shaped washer surrounding the rotating shaft.

* * * * *

UNITED STATES PATENT AND TRADEMARK OFFICE
CERTIFICATE OF CORRECTION

PATENT NO. : 8,905,499 B2  
APPLICATION NO. : 13/908384  
DATED : December 9, 2014  
INVENTOR(S) : Takahisa Yoshizumi et al.

Page 1 of 1

It is certified that error appears in the above-identified patent and that said Letters Patent is hereby corrected as shown below:

In the Claims

Column 16, Line 5, In Claim 1, delete "potion," and insert -- portion, --, therefor.
Column 16, Line 62, In Claim 8, delete "side" and insert -- slide --, therefor.
Column 16, Line 64, In Claim 8, delete "rock" and insert -- lock --, therefor.
Column 16, Line 67, In Claim 9, delete "he" and insert -- the --, therefor.

Signed and Sealed this
Fifth Day of May, 2015

Michelle K. Lee
*Director of the United States Patent and Trademark Office*